(12) United States Patent
Sandhu

(10) Patent No.: US 7,625,766 B2
(45) Date of Patent: Dec. 1, 2009

(54) METHODS OF FORMING CARBON NANOTUBES AND METHODS OF FABRICATING INTEGRATED CIRCUITRY

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 343 days.

(21) Appl. No.: 11/445,708

(22) Filed: Jun. 2, 2006

(65) Prior Publication Data

US 2007/0281452 A1    Dec. 6, 2007

(51) Int. Cl.
   *H01L 21/4763* (2006.01)
(52) U.S. Cl. .................... 438/1; 438/551; 977/742; 977/762; 977/778; 257/E21.295; 257/E21.582; 257/E21.589; 257/E23.165; 257/E27.004; 257/E51.038; 257/E51.04
(58) Field of Classification Search ............ 257/E51.04, 257/E23.117, E27.07, E21.295, 582, 589, 257/E23.165, E27.004, E51.038, 40; 438/1, 438/503, 551, 977, 762, 778, 442
See application file for complete search history.

(56) References Cited

U.S. PATENT DOCUMENTS

| | | | | |
|---|---|---|---|---|
| 6,129,901 | A * | 10/2000 | Moskovits et al. | 423/447.3 |
| 6,250,984 | B1 * | 6/2001 | Jin et al. | 445/51 |
| 6,312,303 | B1 * | 11/2001 | Yaniv et al. | 445/24 |
| 6,325,909 | B1 * | 12/2001 | Li et al. | 205/106 |
| 6,706,402 | B2 * | 3/2004 | Rueckes et al. | 428/408 |
| 6,803,260 | B2 * | 10/2004 | Shin et al. | 438/142 |
| 6,803,840 | B2 * | 10/2004 | Hunt et al. | 333/186 |
| 6,864,162 | B2 * | 3/2005 | Jin | 438/551 |
| 6,887,450 | B2 * | 5/2005 | Chen et al. | 423/445 R |
| 7,129,097 | B2 * | 10/2006 | Furukawa et al. | 438/1 |
| 7,172,953 | B2 * | 2/2007 | Lieber et al. | 438/503 |
| 2007/0023839 | A1 * | 2/2007 | Furukawa et al. | 257/353 |

OTHER PUBLICATIONS

Han et al., *Template-Free Directional Growth of Single-Walled Carbon Nanotubes on a- and r-Plane Sapphire*, J. Am. Chem. Soc., vol. 127, No. 15, pp. 5294-5295 (2005).
Meyyappan et al., *Carbon nanotube growth by PECVD: a review*, Plasma Sources Sci. Technol., 12, pp. 205-216 (2003).

\* cited by examiner

*Primary Examiner*—Michael S Lebentritt
(74) *Attorney, Agent, or Firm*—Wells St. John P.S.

(57) ABSTRACT

A step wall is formed over a substrate. Catalytic material of different composition than the step wall is provided proximate thereto. A carbon nanotube is grown from the catalytic material along the step wall generally parallel to the substrate. A method of fabricating integrated circuitry includes forming a step wall over a semiconductor substrate. Catalytic material is provided proximate the step wall. An elevationally outer surface of the catalytic material is masked with a masking material. The catalytic material and the masking material are patterned to form an exposed end sidewall of the catalytic material proximate the step wall, with remaining of the elevationally outer surface of the catalytic material being masked. A carbon nanotube is grown from the exposed end sidewall of the catalytic material along the step wall generally parallel to the semiconductor substrate. The carbon nanotube is incorporated into a circuit component of an integrated circuit.

49 Claims, 26 Drawing Sheets

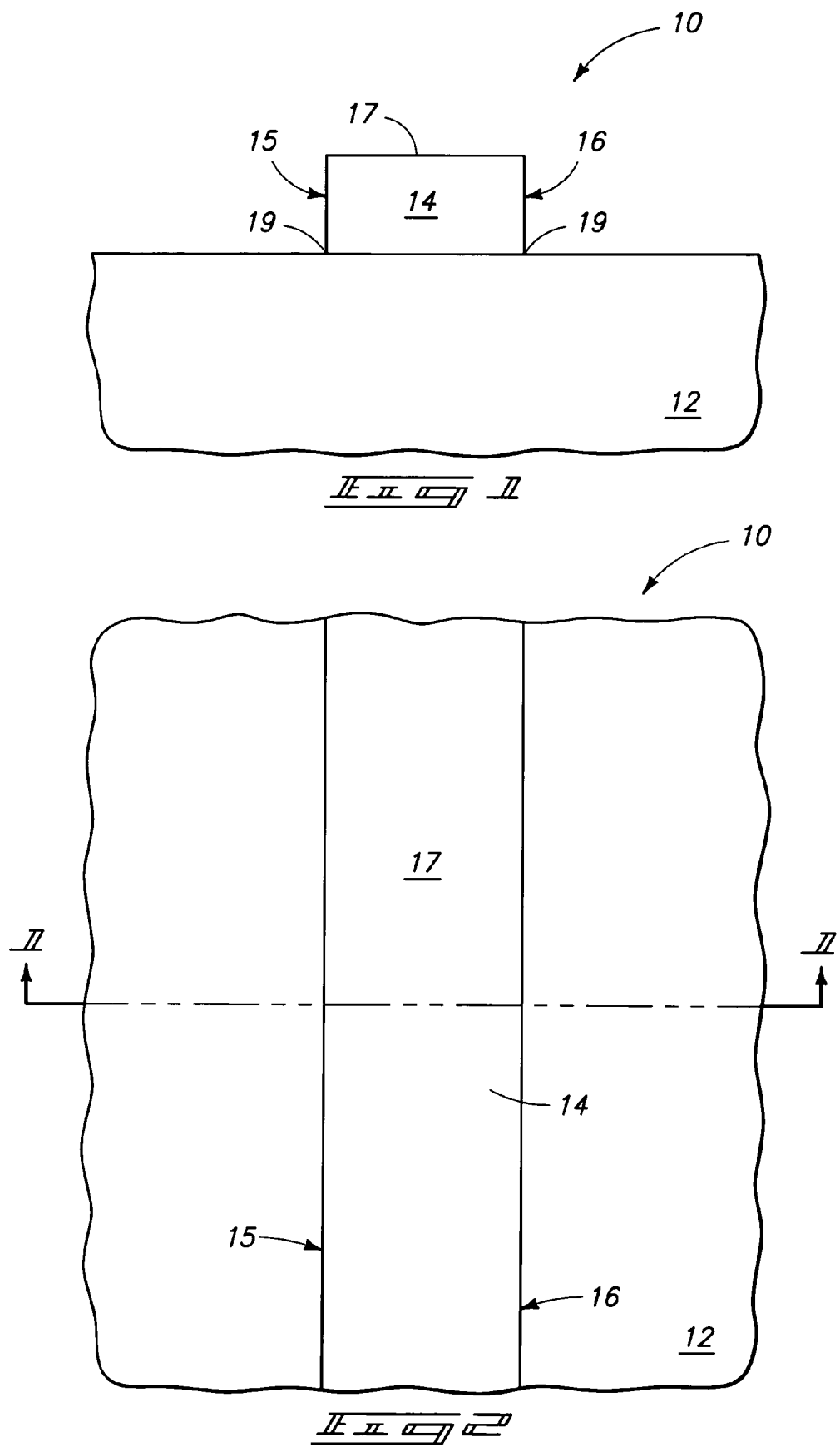

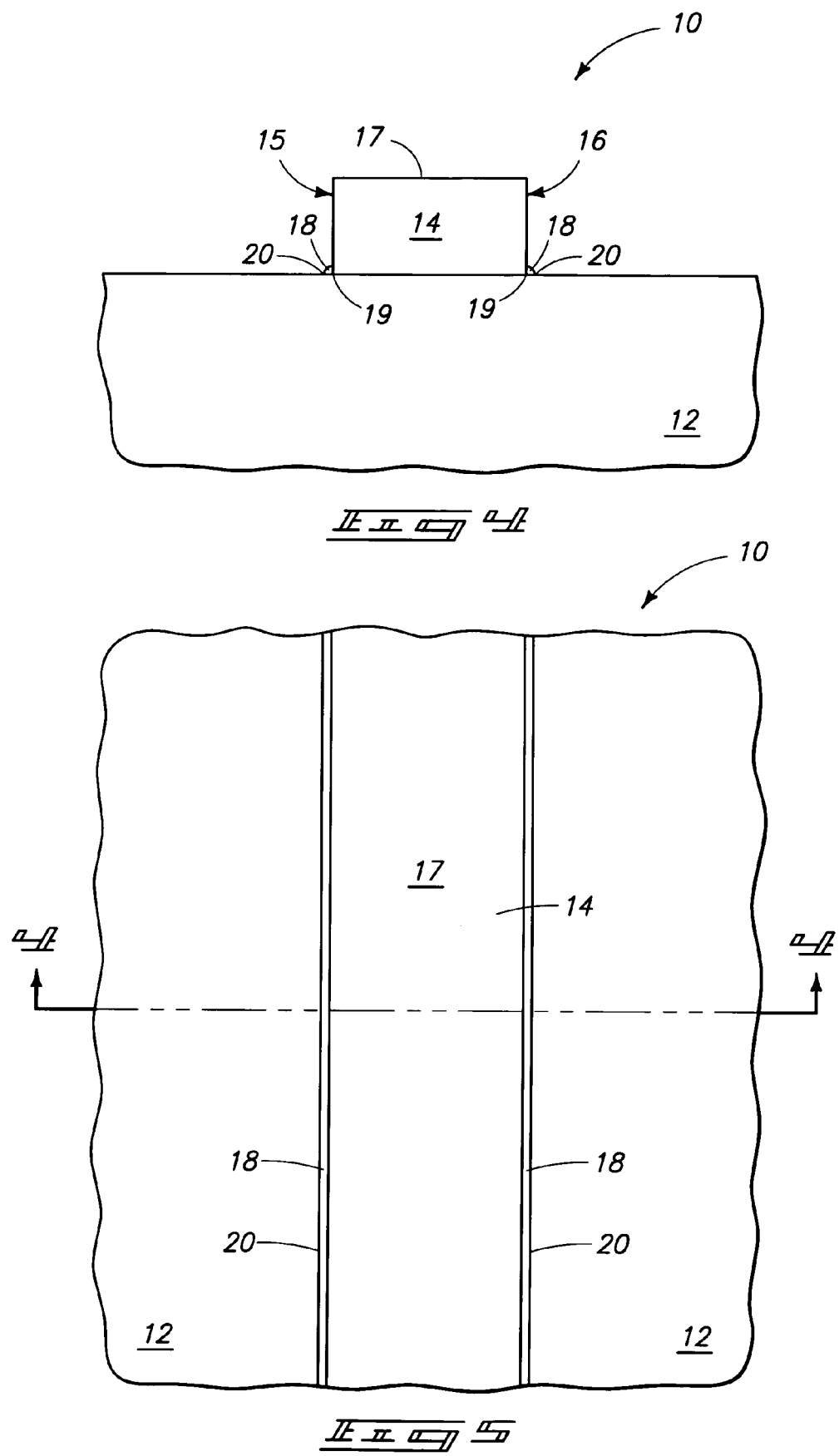

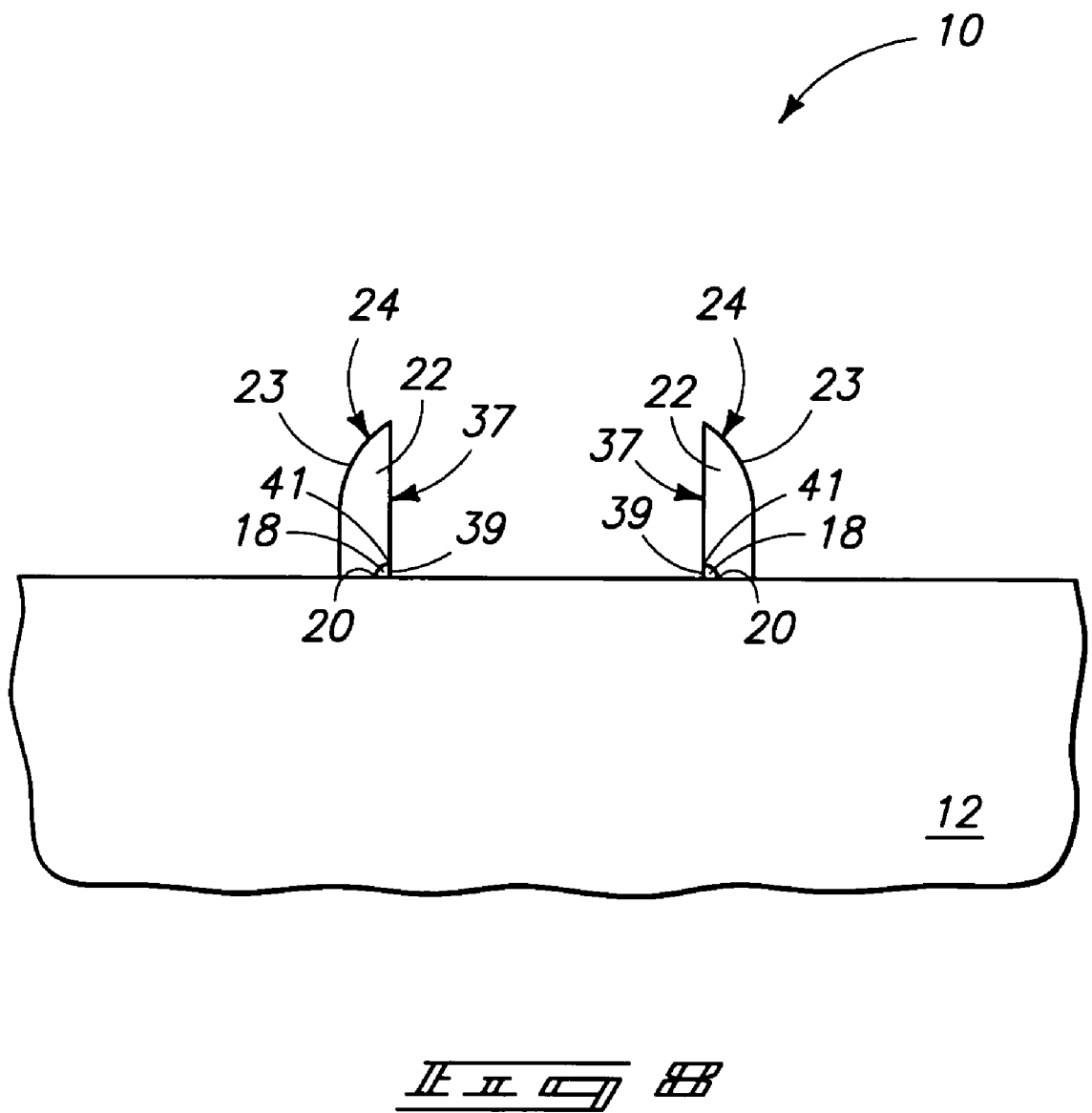

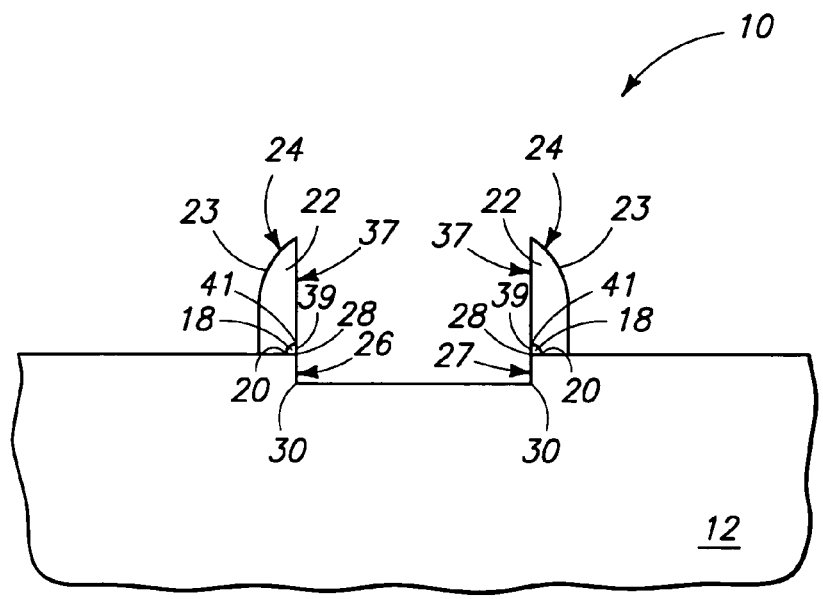
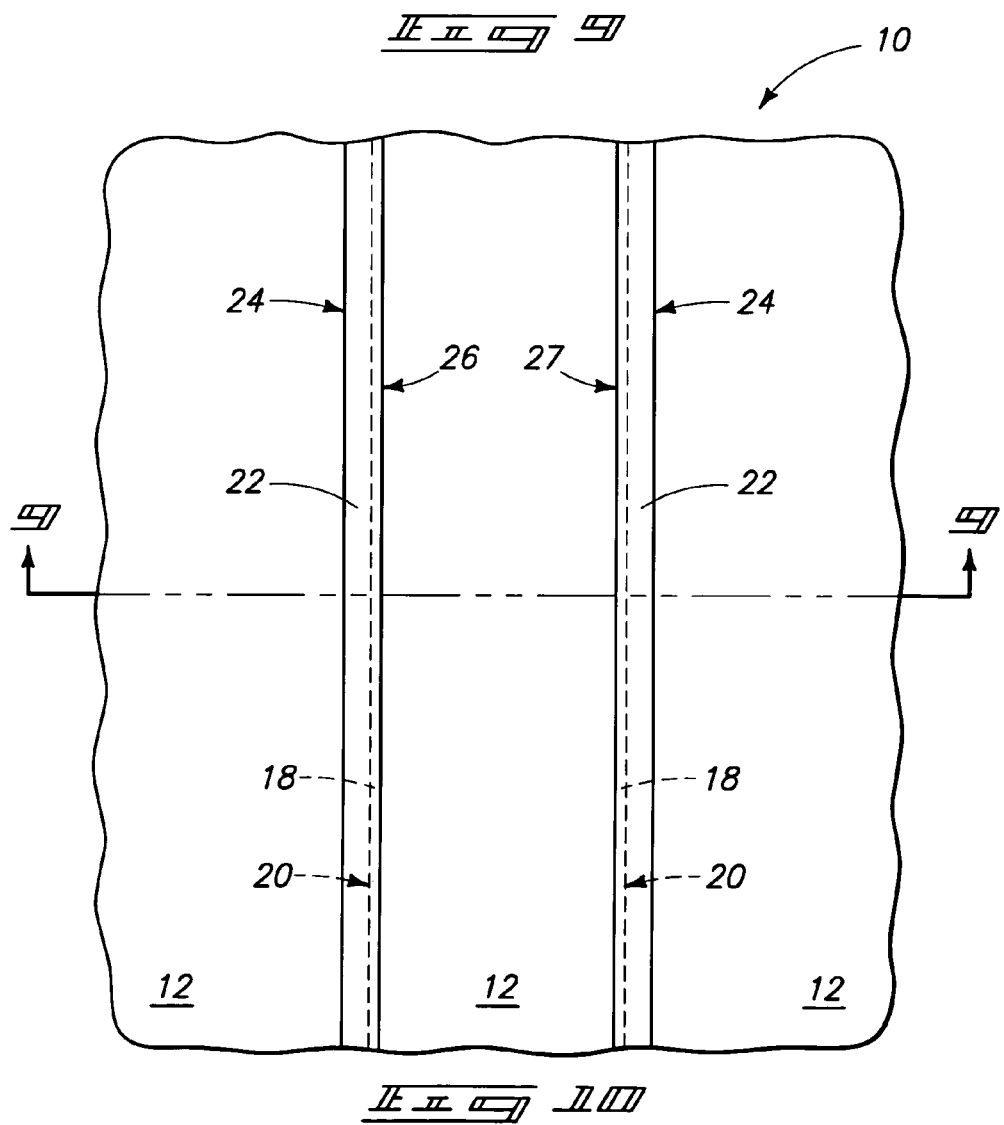

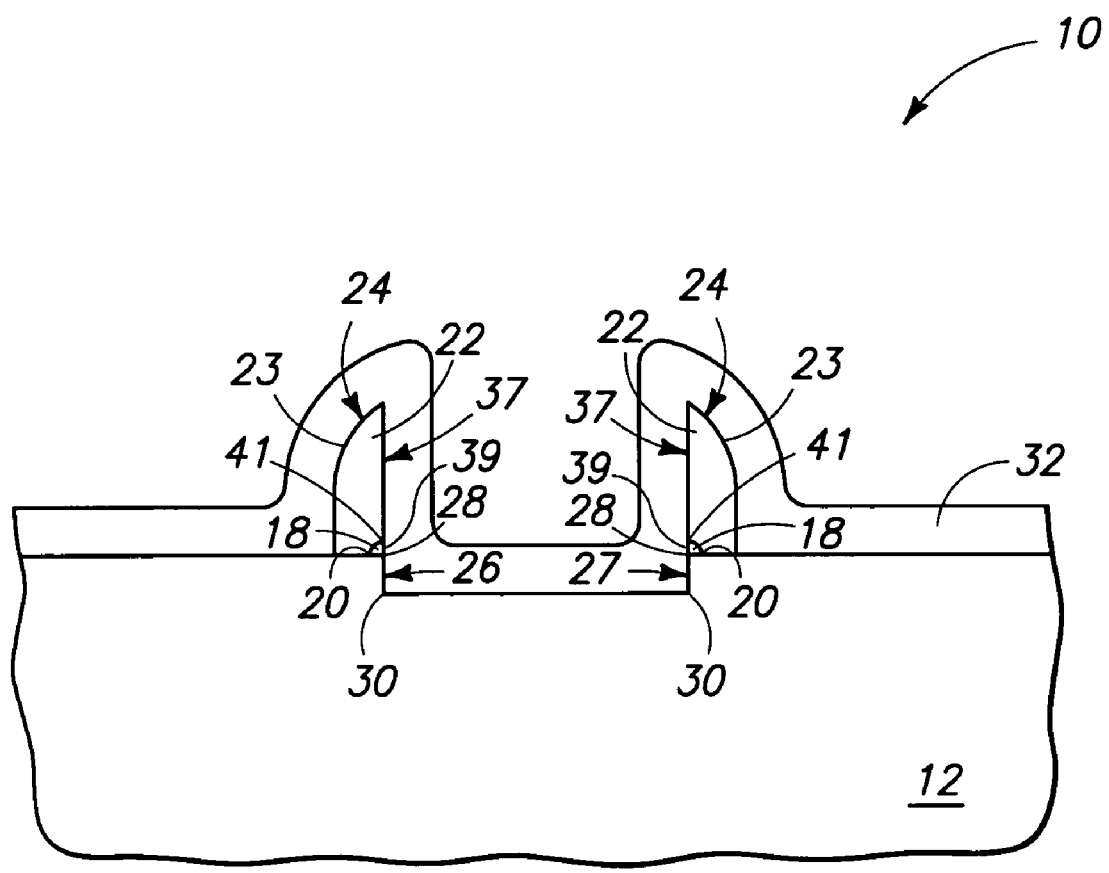

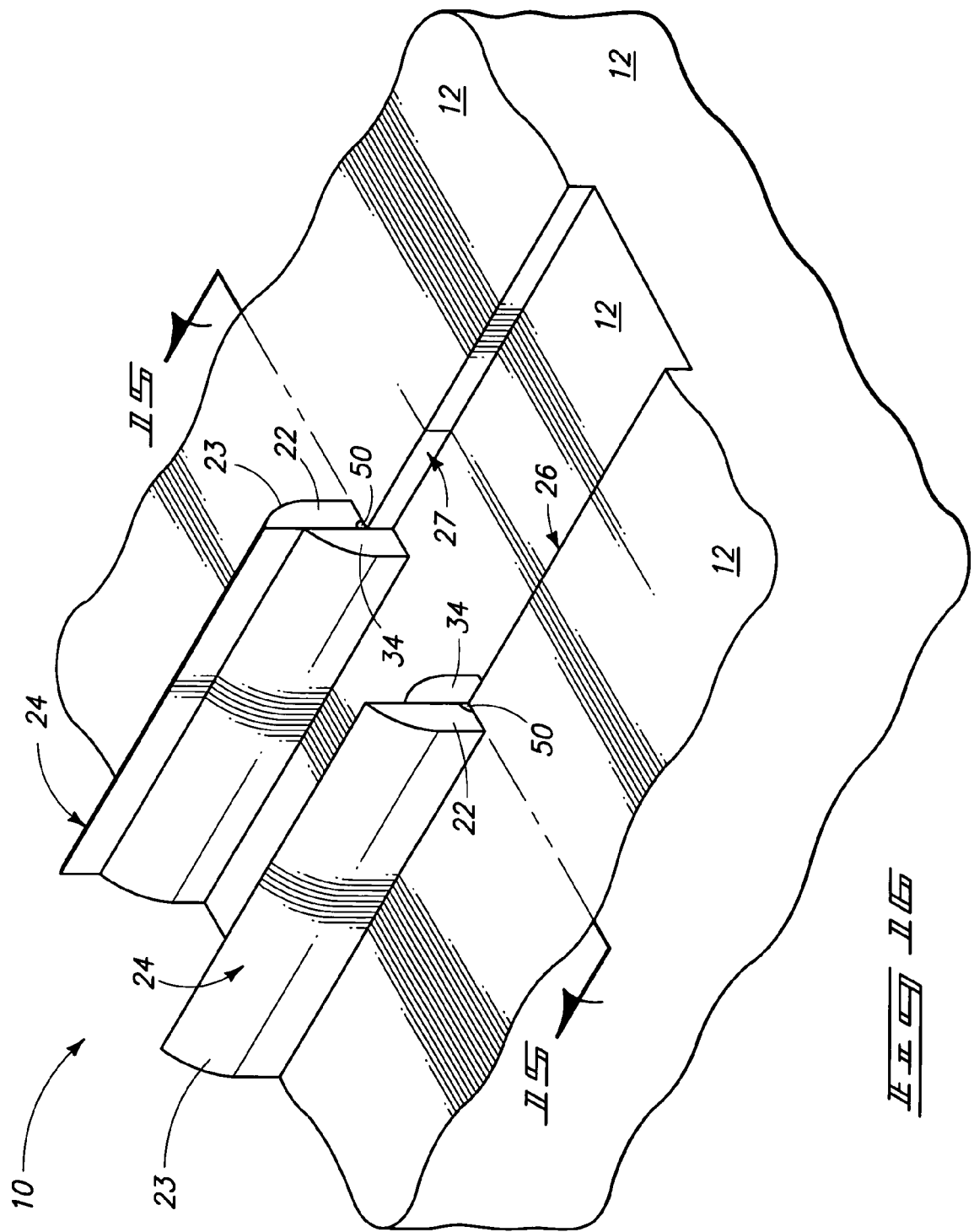

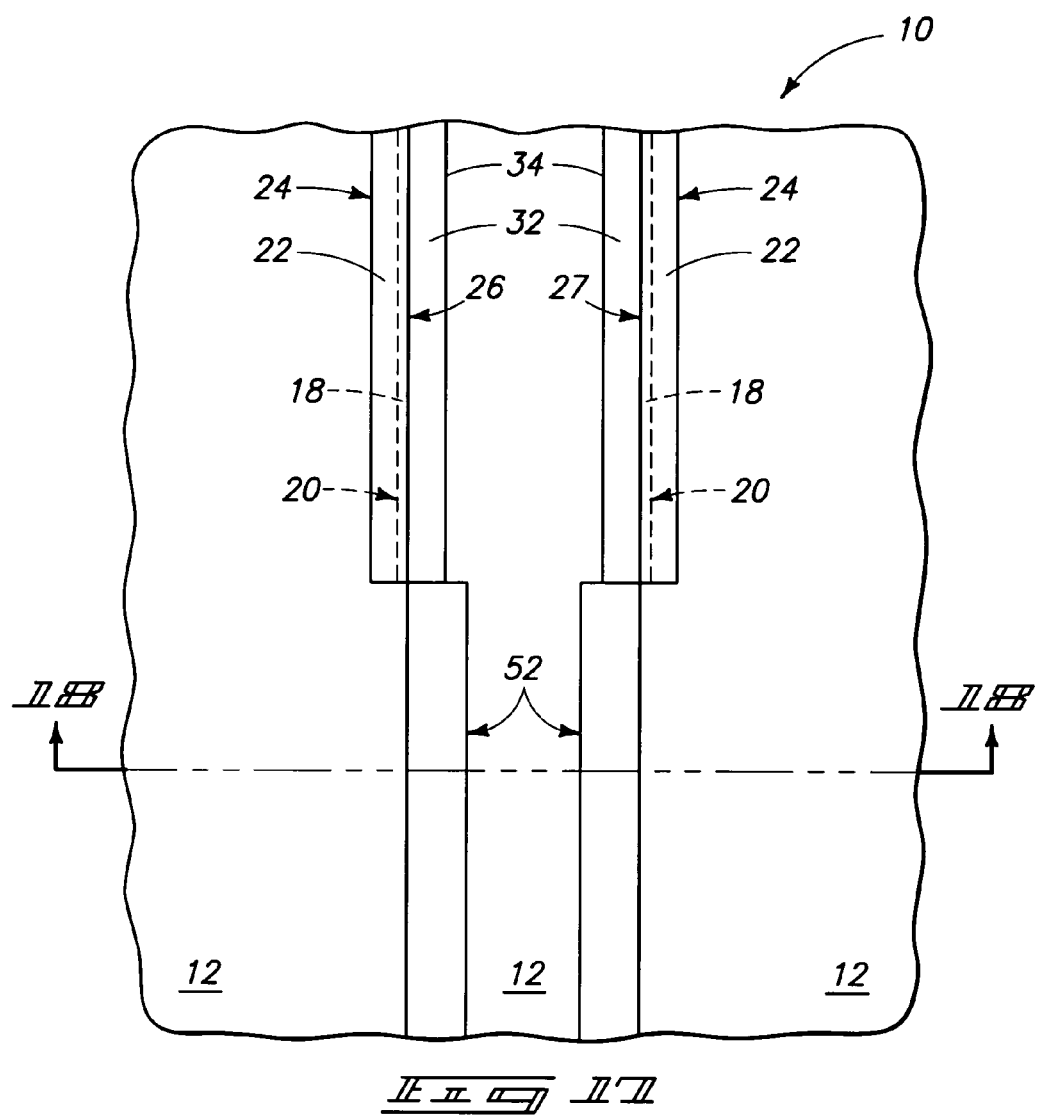
$\overline{\mathbb{F}\mathbb{F}\mathbb{G}}$ $\mathbb{F}\mathbb{F}$
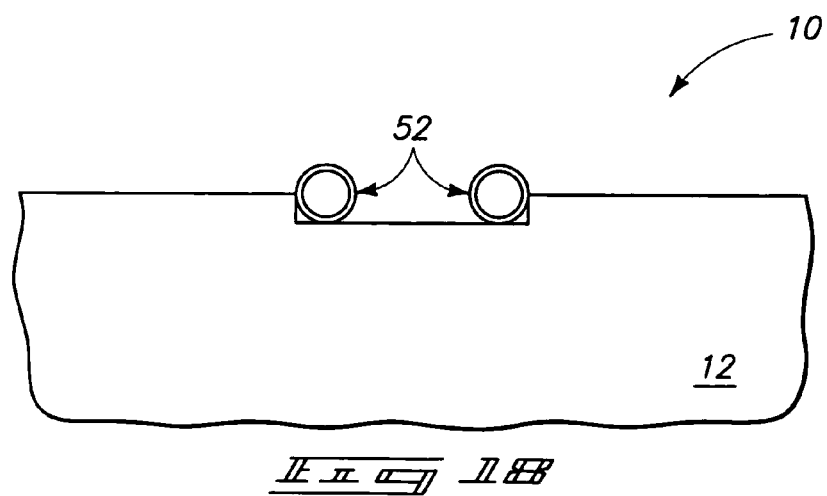
$\overline{\mathbb{F}\mathbb{F}\mathbb{G}}$ $\mathbb{F}\mathbb{F}$

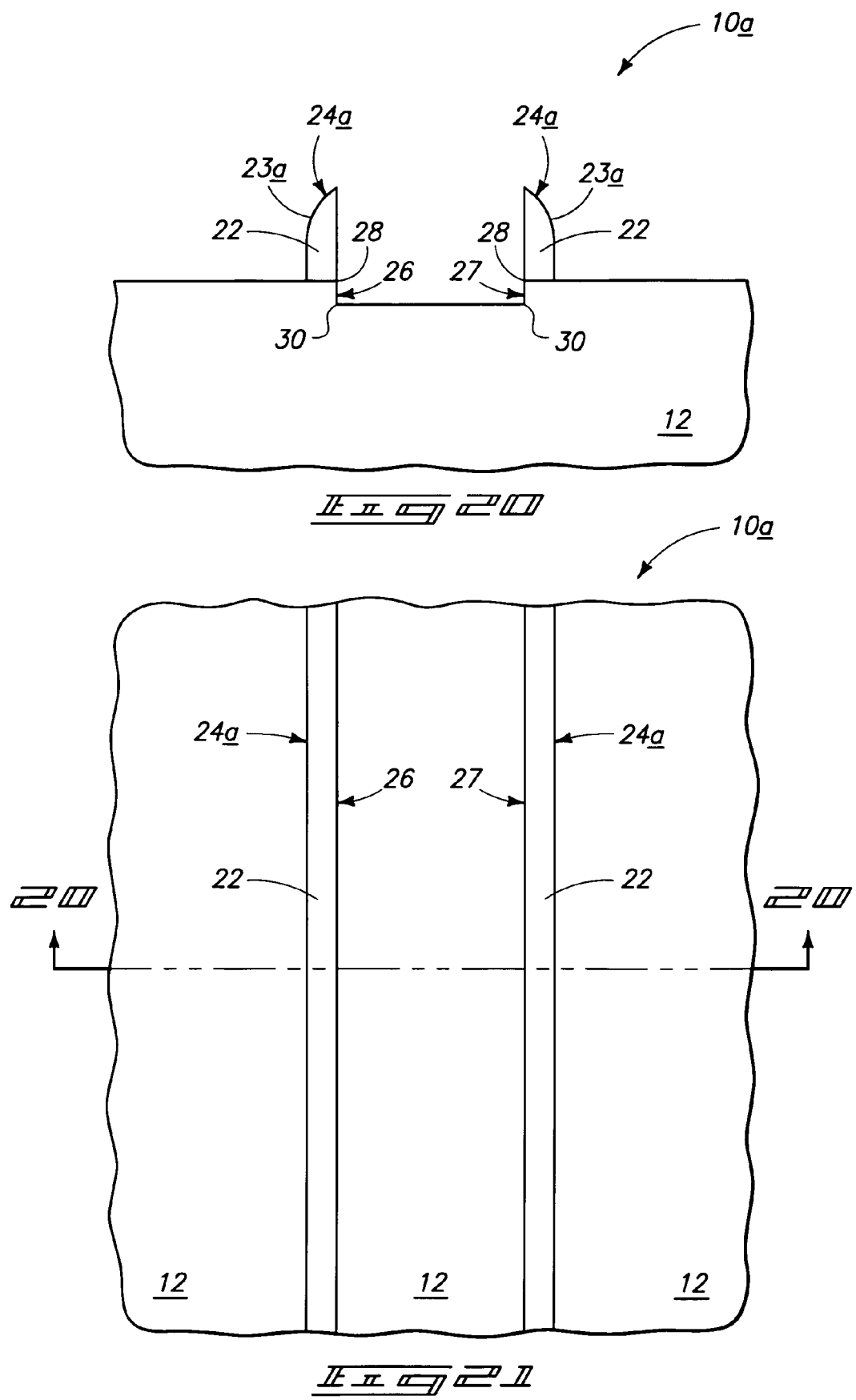

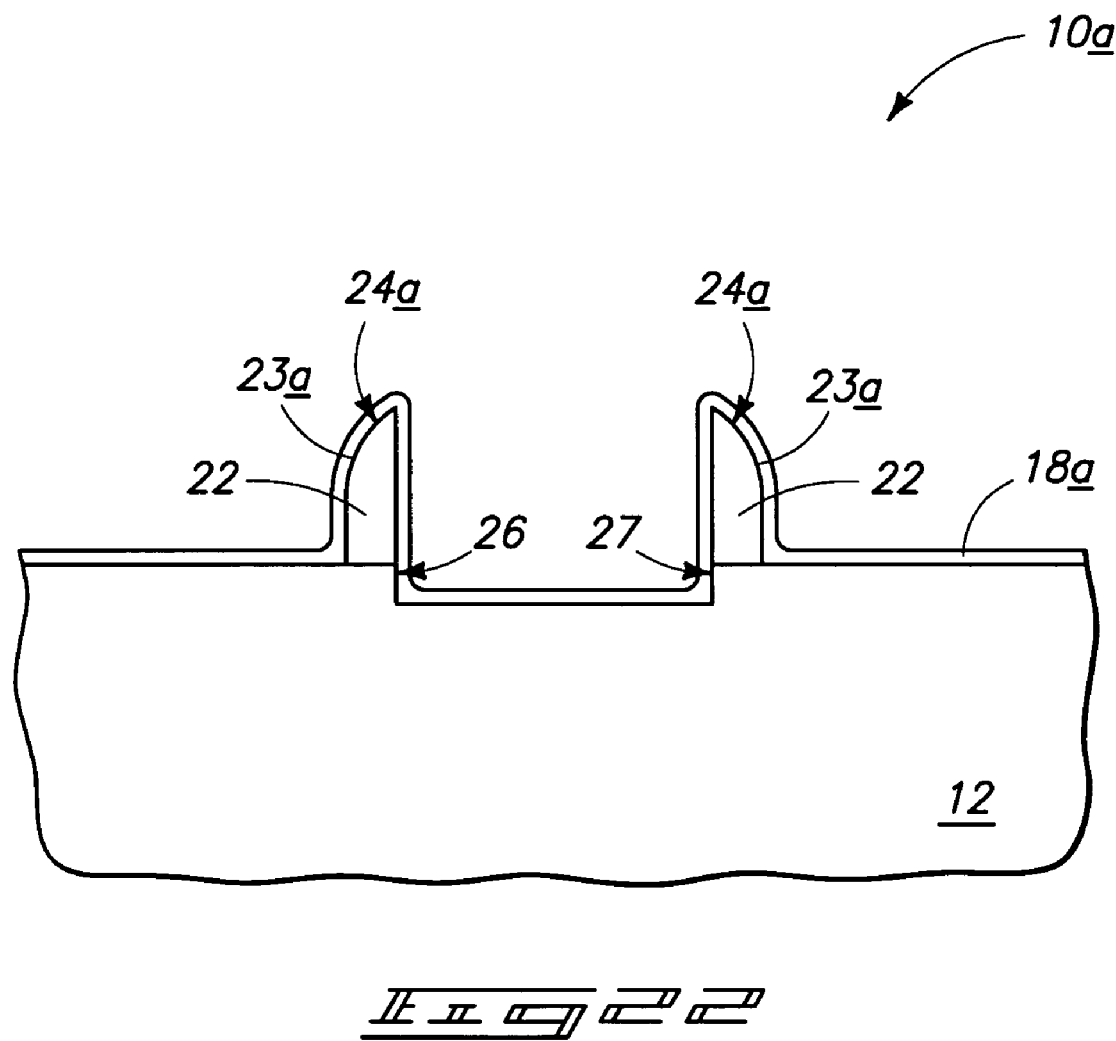

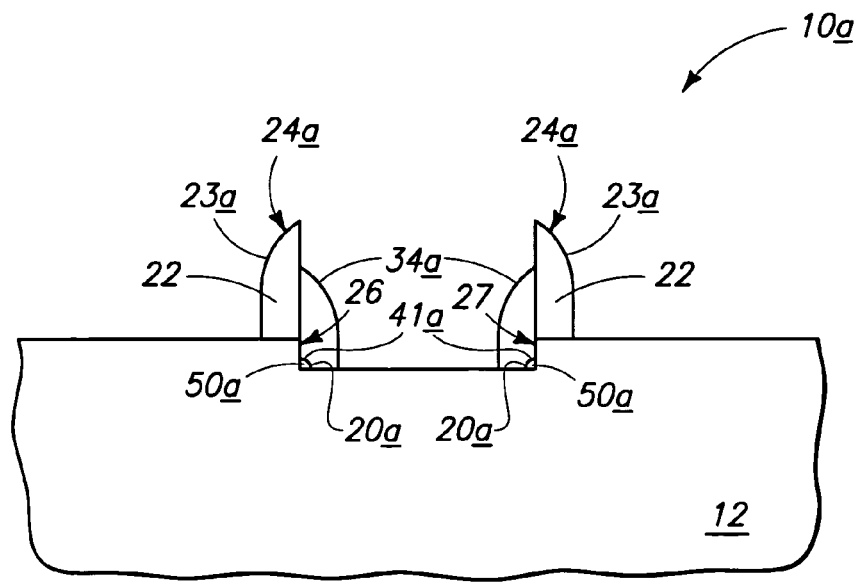
_FIG 27_
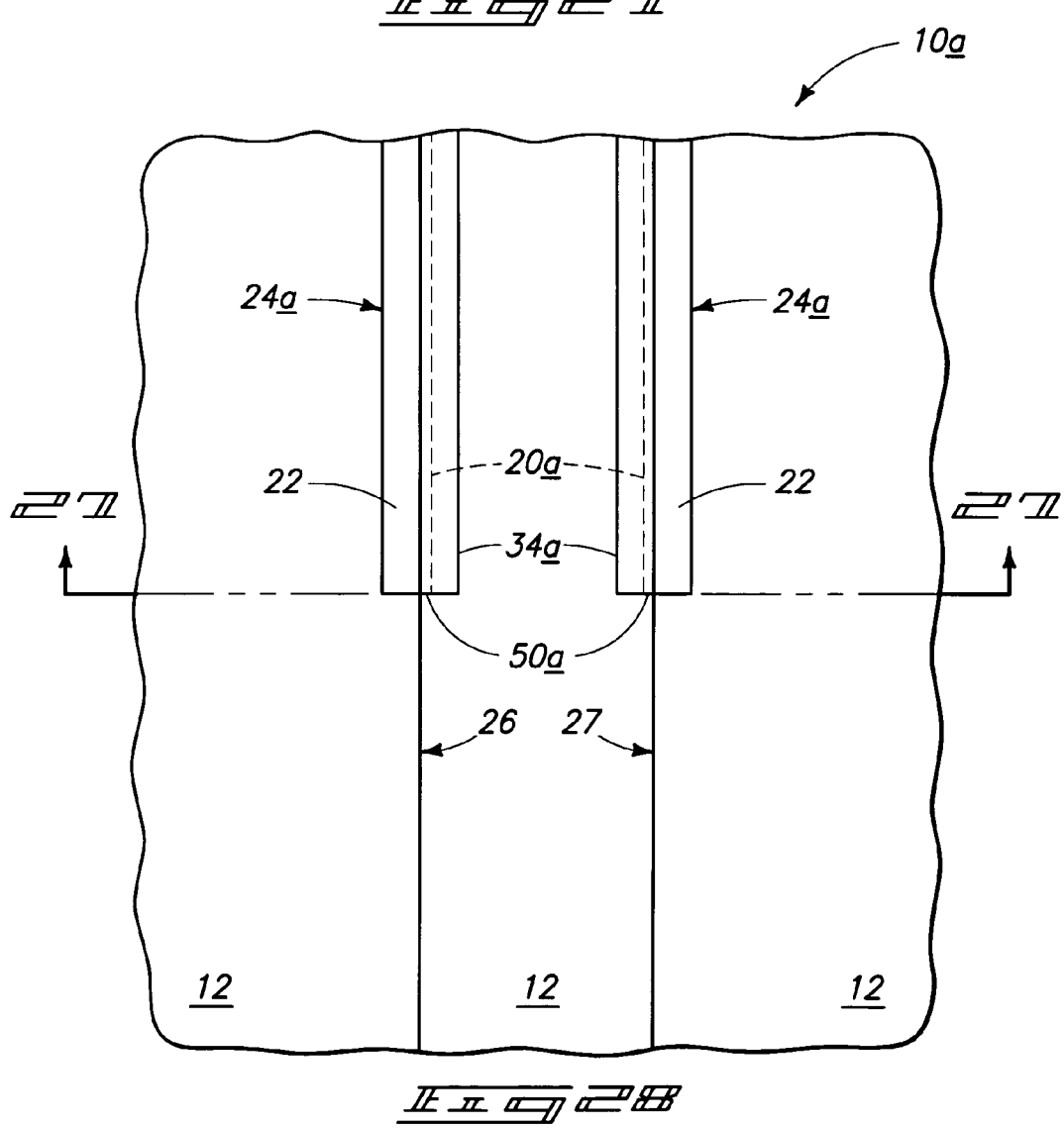
_FIG 28_

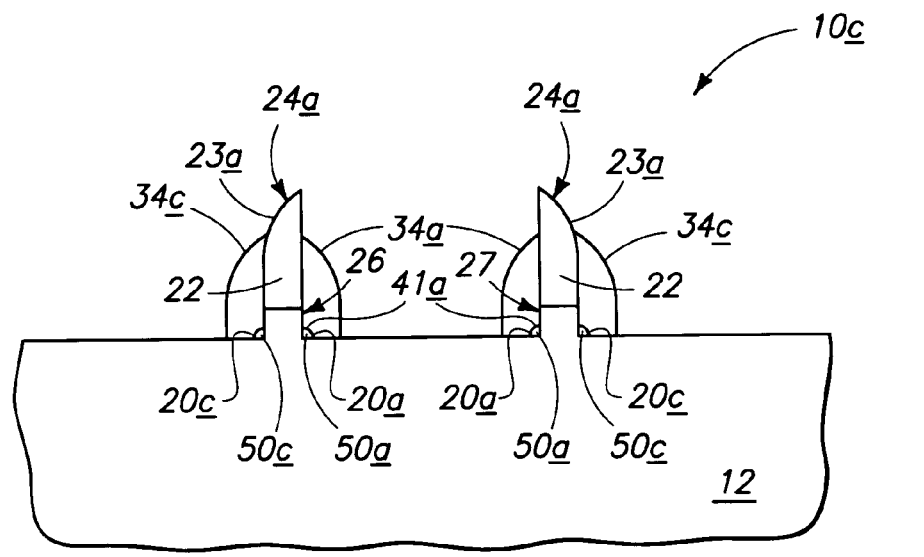
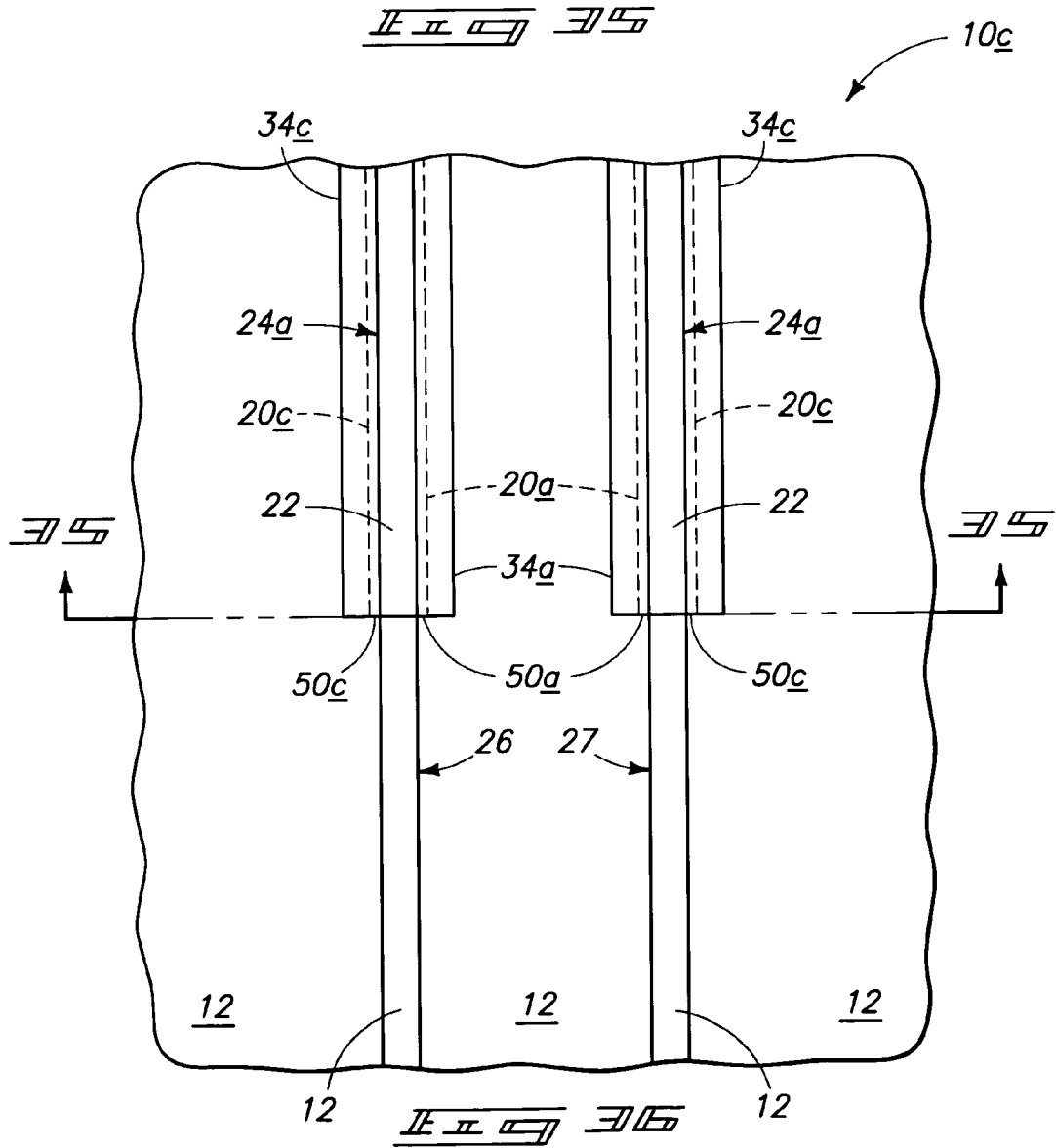

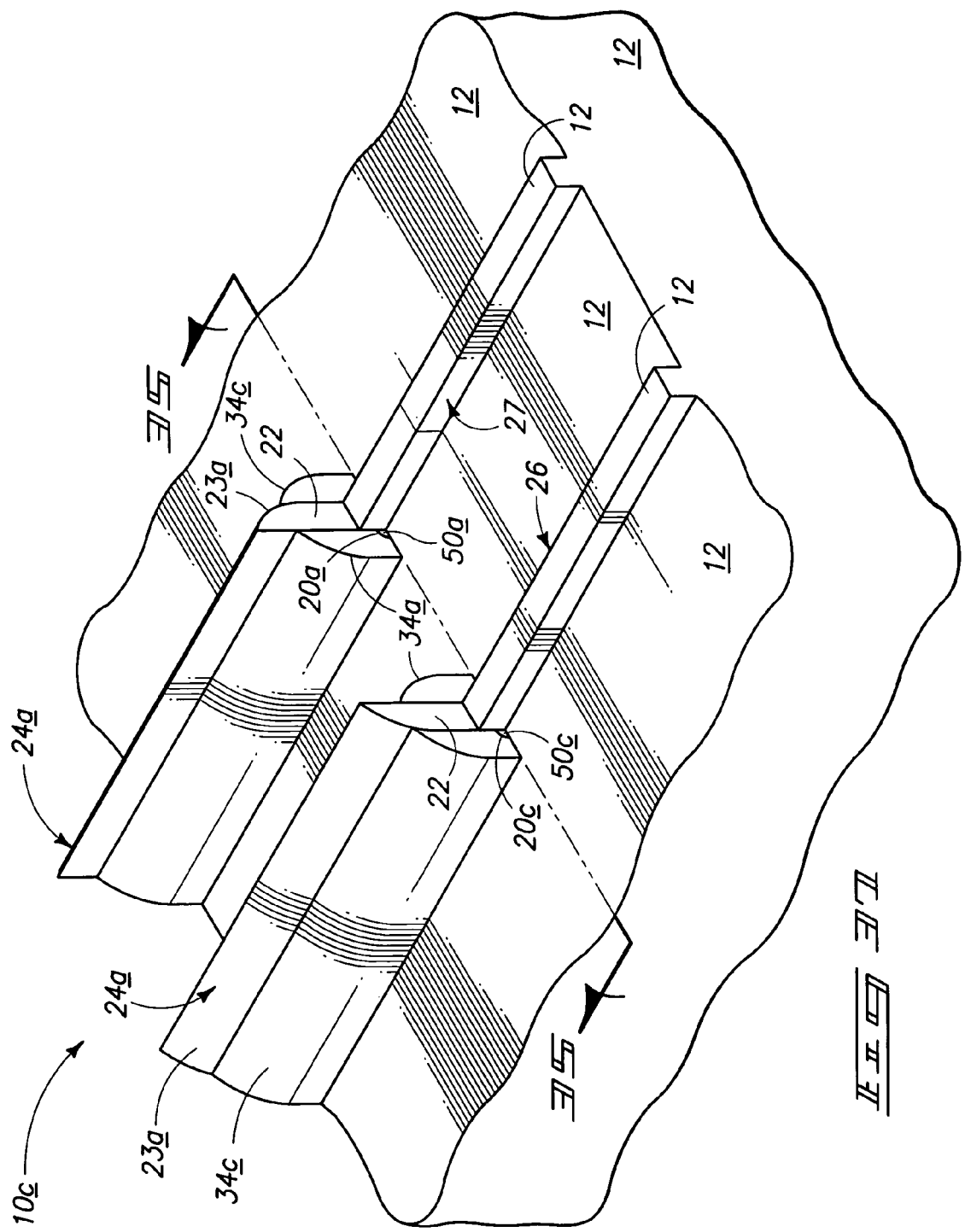

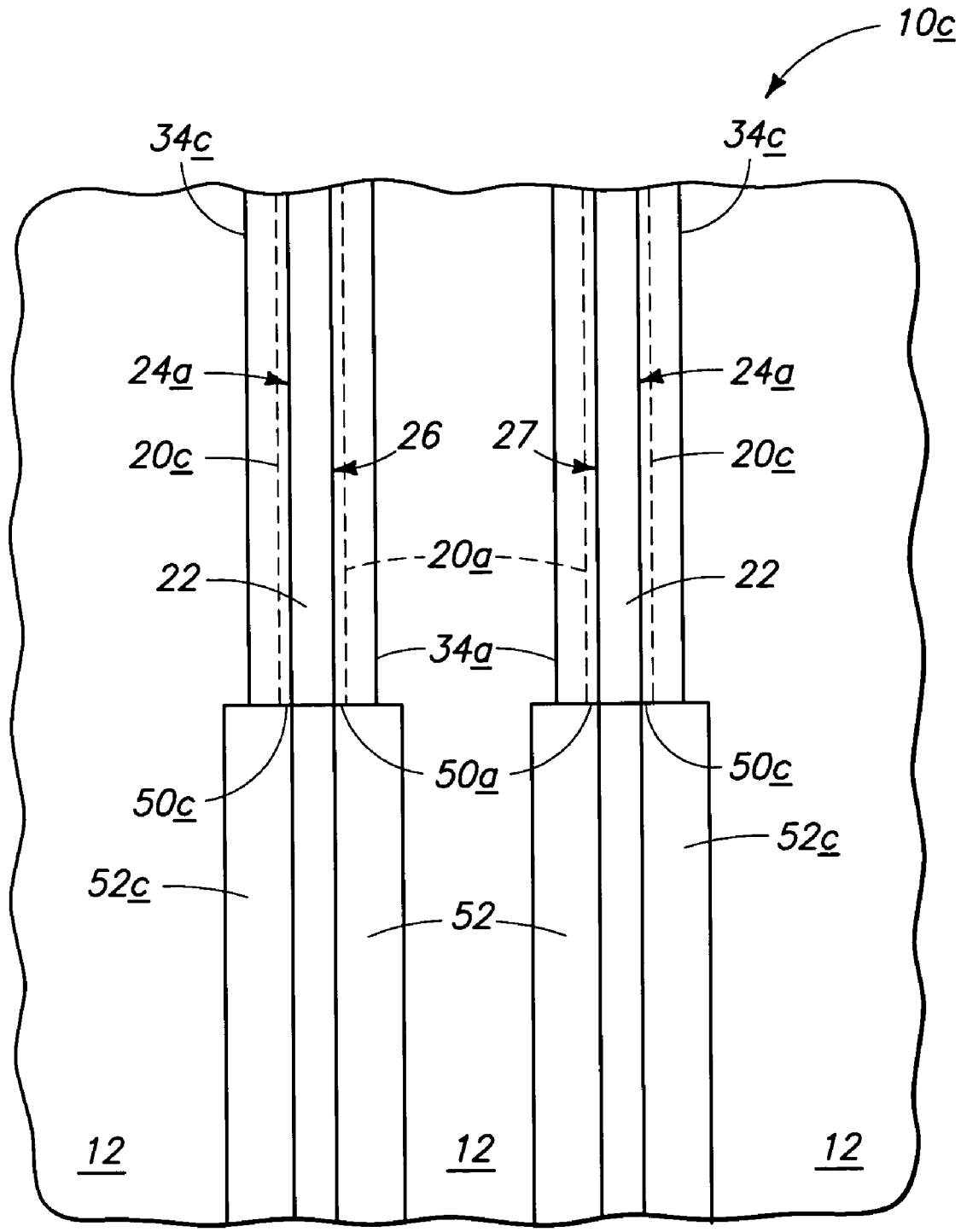

METHODS OF FORMING CARBON NANOTUBES AND METHODS OF FABRICATING INTEGRATED CIRCUITRY

TECHNICAL FIELD

This invention relates to methods of forming carbon nanotubes, and to methods of fabricating integrated circuitry.

BACKGROUND OF THE INVENTION

Carbon nanotubes are cylindrical carbon molecules or structures with novel properties that make them potentially useful in a wide variety of applications. They exhibit extraordinary strength and unique electrical properties and are good conductors of heat.

Carbon nanotubes can occur in single-walled and multi-walled forms. The structure of a single-walled nanotube can be conceptualized by wrapping a 1 atom-thick layer of graphite/graphene (typically of a plurality of hexagonal unit cells) into a seamless cylinder. The way the conceptualized graphene sheet is wrapped can determine different resultant properties of the carbon nanotube, for example electrical properties such as being one of conductive, insulative, or semiconductive. Multi-walled nanotubes can be conceptualized as multiple layers of graphite/graphene rolled in on themselves to form a tube shape. The interesting combination of electronic and mechanical properties of carbon nanotubes has lead to wide ranging proposals for their potential use in future electronics and computing, field emitter devices, sensors, electrodes, high strength composites, and storage structures of hydrogen, lithium and other metals.

Many techniques have been developed to produce carbon nanotubes in sizeable quantities, including arc discharge, laser oblation, high pressure carbon monoxide, and chemical vapor deposition which may or may not be plasma enhanced. Chemical vapor deposition of carbon nanotubes presently typically reacts a carbon-containing gas (i.e., acetylene, ethylene, ethanol, etc.) with a metal catalyst particle (usually cobalt, nickel, iron, molybdenum, or a combination of these such as cobalt/iron or cobalt/molybdenum) at some suitable elevated temperatures, typically above 600° C. It is presently believed that the catalyst on the substrate for carbon nanotube growth needs to be in the form of particles instead of smooth/continuous films, although the invention as disclosed and utilized herein does not preclude use of later-developed such films or non-particle-like growth mechanisms.

Further, present generation carbon nanotube growth correlates catalyst particle size with the diameter of the resulting nanotubes. Carbon nanotubes might be one nanometer or less in diameter, and can be grown to several microns in length. Further and accordingly, a challenge exists in positioning of catalyst particles for growth of carbon nanotubes in desired locations on substrates.

Carbon nanotube growth from catalyst particles typically occurs by one of base or tip growth mechanisms. In a base growth mechanism, the particle typically remains stationary, and a carbon nanotube grows outwardly therefrom. In a tip growth mechanism, the catalyst particle typically moves away from the base substrate such that the carbon nanotube grows from the substrate inwardly of the catalyst particle with the particle being received at the outermost end of the growing nanotube. For example, a hydrocarbon such as methane adsorbed onto the catalytic particle surface can release carbon upon decomposition which dissolves and diffuses into the particle. When a supersaturated state is reached, carbon precipitates in a crystalline tubular form. At this juncture, two different scenarios are possible. If the particle adherence to the surface is strong, then carbon precipitates from the top surface of the particle and the filament continues to grow generally perpendicular to the substrate with the particle anchored to the substrate. This is called the base growth model. In cases where the particle attachment to the surface is weak, then carbon precipitation occurs at the bottom surface of the particle and the filament lifts the particle as it grows generally perpendicular to the substrate. In this case, the top end of the filament is decorated with the catalyst particle, and is referred to as the tip growth model.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

FIG. 1 is a diagrammatic section view of a substrate fragment in process in accordance with an aspect of the invention.

FIG. 2 is a top view of FIG. 1, with FIG. 1 being taken through line 1-1 in FIG. 2.

FIG. 4 is a view of the FIG. 3 substrate fragment at a processing step subsequent to that shown by FIG. 3.

FIG. 5 is a top view of FIG. 4, with FIG. 4 being taken through line 4-4 in FIG. 5.

FIG. 8 is a view of the FIG. 7 substrate fragment at a processing step subsequent to that shown by FIG. 7.

FIG. 9 is a view of the FIG. 8 substrate fragment at a processing step subsequent to that shown by FIG. 8.

FIG. 10 is a top view of FIG. 9, with FIG. 9 being taken through line 9-9 in FIG. 10.

FIG. 11 is a view of the FIG. 9 substrate fragment at a processing step subsequent to that shown by FIG. 9.

FIG. 16 is a perspective view of the FIGS. 14 and 15 substrate fragment.

FIG. 17 is a top view of the FIG. 14 substrate fragment at a processing step subsequent to that shown by FIG. 14.

FIG. 18 is a sectional view of the FIG. 17 substrate fragment taken through line 18-18 in FIG. 17.

FIG. 20 is a view of the FIG. 19 substrate fragment at a processing step subsequent to that shown by FIG. 19.

FIG. 21 is a top view of FIG. 20, with FIG. 20 being taken through line 20-20 in FIG. 21.

FIG. 22 is a view of the FIG. 20 substrate fragment at a processing step subsequent to that shown by FIG. 20.

FIG. 27 is a view of the FIG. 25 substrate fragment at a processing step subsequent to that shown by FIG. 25.

FIG. 28 is a top view of FIG. 27, with FIG. 27 being taken through line 27-27 in FIG. 28.

FIG. 30 is a top view of the FIG. 28 substrate fragment at a processing step subsequent to that shown by FIG. 28.

FIG. 35 is a diagrammatic section view of an alternate embodiment substrate fragment processed in accordance with an aspect of the invention.

FIG. 36 is a top view of FIG. 35, with FIG. 35 being taken through line 35-35 in FIG. 36.

FIG. 37 is a perspective view of the FIGS. 35 and 36 substrate fragment.

FIG. 38 is a top view of the FIG. 36 substrate fragment at a processing step subsequent to that shown by FIG. 36.

DETAILED DESCRIPTION OF THE PREFERRED EMBODIMENTS

Figure 3:
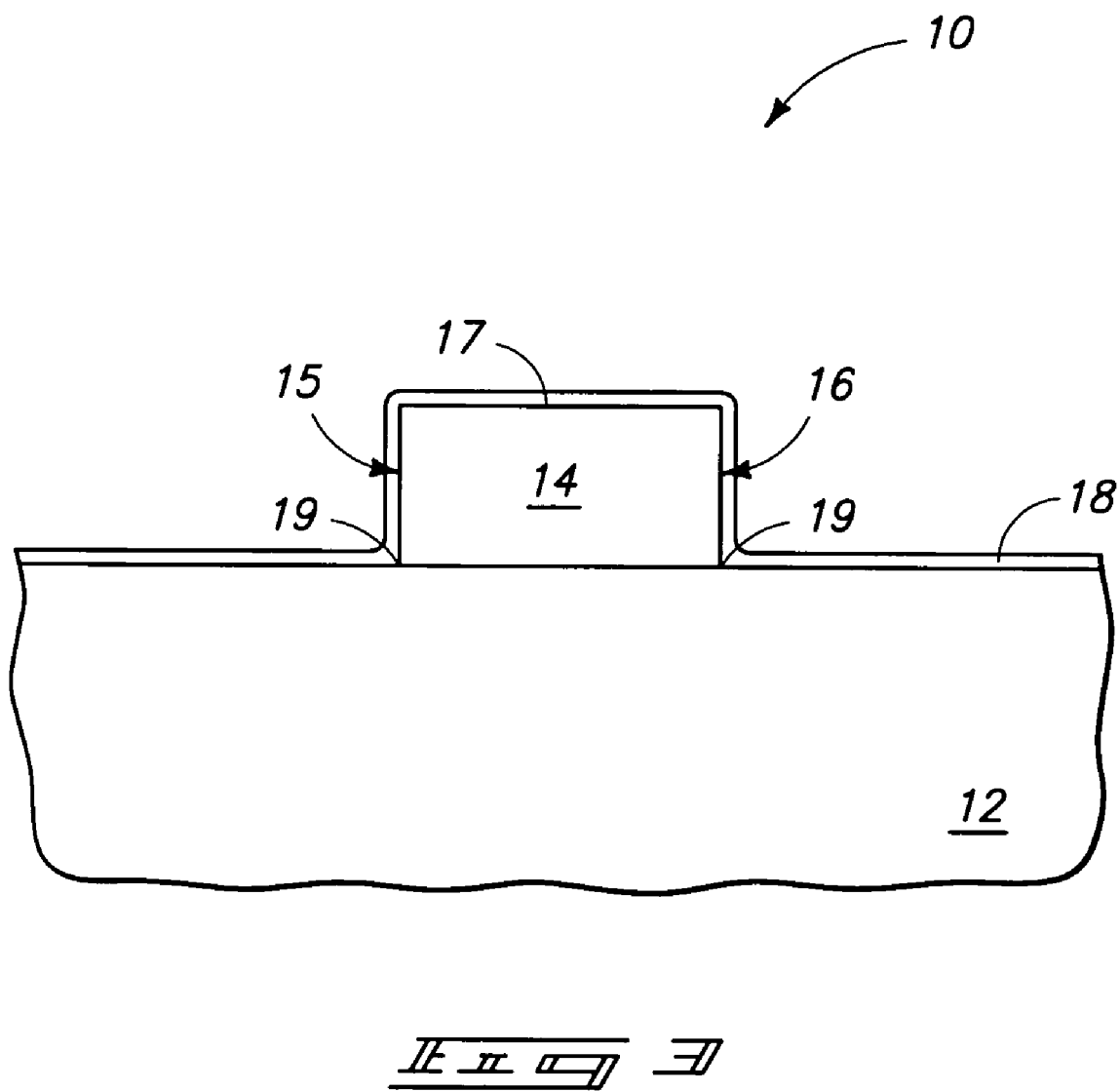
FIG. 3 is a view of the FIG. 1 substrate fragment at a processing step subsequent to that shown by FIG. 1.

This disclosure of the invention is submitted in furtherance of the constitutional purposes of the U.S. Patent Laws "to promote the progress of science and useful arts" (Article 1, Section 8).

The invention includes methods of fabricating carbon nanotubes, including methods of fabricating integrated circuitry comprising carbon nanotubes. Accordingly in some implementations, the fabricated carbon nanotubes might not necessarily be incorporated in the fabrication of electronic circuit components. Regardless, it has been discovered that a carbon nanotube can be grown from catalytic material along a step wall in an orientation which is generally parallel to the substrate over or upon which the step wall is formed. Accordingly, provision of catalytic material proximate a step wall can be used to grow carbon nanotubes generally parallel to the substrate orientation using, by way of example only, any of the above generally referred to carbon nanotube growth techniques, and techniques which might be later developed. Aspects of the invention also encompass, along with such growth, provisional positioning of catalytic material proximate a step wall in one or more desired orientations such that a carbon nanotube can be grown in an orientation and where desired. Various implementations, by way of example only, are described in connection with the figures included herein.

First exemplary implementations of methods of forming a carbon nanotube, and methods of fabricating integrated circuitry, are described with reference to FIGS. 1-18. In FIGS. 1 and 2, a substrate fragment is indicated generally with reference numeral 10. In one preferred implementation, substrate 10 comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate fragment 10 is depicted as comprising some base substrate 12 which might comprise one or more different materials and/or layers, and/or be homogenous. Accordingly by way of example only, substrate 12 might comprise bulk monocrystalline silicon, a semiconductor-on-insulator substrate, or any other substrate whether existing or yet-to-be developed. A patterned mask 14 has been formed over substrate 12. For purposes of the continuing discussion, such can be considered as comprising sidewalls 15, 16 and an upper surface 17. Further, mask sidewalls 15 and 16 can be considered as comprising a base 19 proximate where mask 14 meets an outermost surface of substrate 12. In one implementation, patterned mask 14 might be entirely sacrificial, and regardless might be any one or combination of conductive, insulative, or semiconductive materials. One exemplary preferred material comprises carbon. Alternate materials, by way of example only, include polysilicon and nitrides (i.e., $Si_3N_4$ and/or conductive metal nitrides).

Referring to FIG. 3, catalytic material 18 has been deposited over patterned mask 14. In the context of this document, "catalytic" refers to any substance from which or with which a carbon nanotube can be grown by any existing or yet-to-be developed manner. Material 18 is preferably made of metal, such as iron, nickel, cobalt, or molybdenum. In the context of this document, "metal" is defined by any of one or more elemental metals, an alloy of elemental metals, or conductive metal compounds. An exemplary preferred thickness range for layer 18 is from 10 Angstroms to 80 Angstroms.

Referring to FIGS. 4 and 5, catalytic material 18 has been etched to form catalytic masses 20 over substrate 10 proximate bases 19 of mask sidewalls 15 and 16. In one preferred implementation, such etching to form a catalytic mass 20 forms such mass in the shape of a bead along the base of the mask sidewall, and wherein preferably the bead has a thickness less than height of the mask sidewall. An exemplary preferred height or thickness for catalytic masses 20 is from 5 Angstroms to 30 Angstroms. By way of example only, an exemplary preferred technique for forming catalytic masses 20 is by a timed, maskless, essentially anisotropic spacer etch to form masses 20 of desired elevational thickness. An exemplary etching chemistry to achieve the same where catalytic material 18 comprises nickel and/or cobalt includes chlorine containing hydrocarbon gas mixtures, or hydrocarbon plus $Cl_2$ gas mixtures, in a plasma chamber under sufficient bias to provide for a directional spacer etch.

Figure 6:
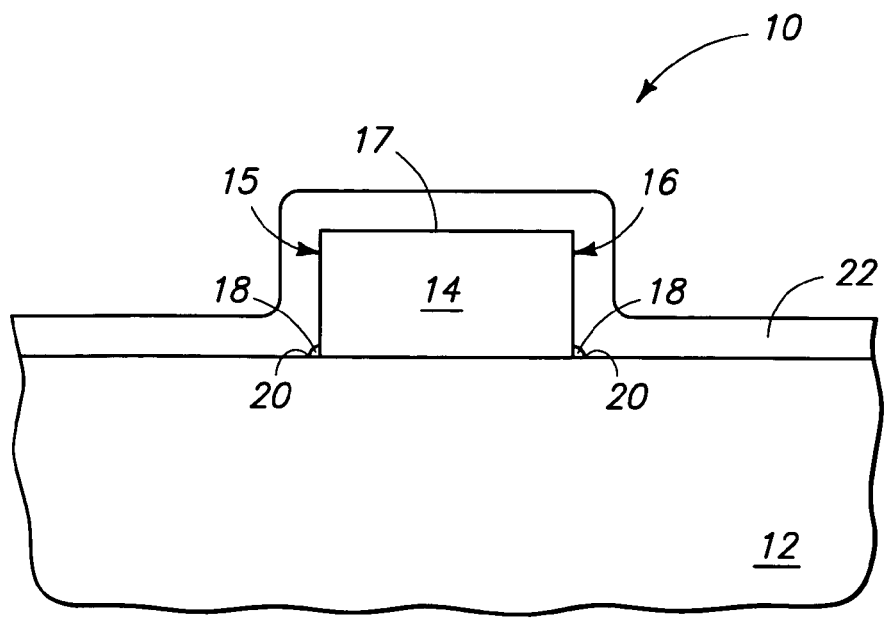
FIG. 6 is a view of the FIG. 4 substrate fragment at a processing step subsequent to that shown by FIG. 4.

Referring to FIG. 6, a layer 22 has been deposited over substrate 12, including over mask sidewalls 15, 16 and catalytic masses 20. Material 22 might or might not be sacrificial, and regardless preferably comprises a material from which material of patterned mask 14 can be selectively etched relative thereto. In the context of this document, a selective etch requires etching a one material relative to another at a removal rate of at least 2:1. By way of example only where patterned mask 14 comprises carbon, an exemplary material 22 is silicon dioxide.

Figure 7:
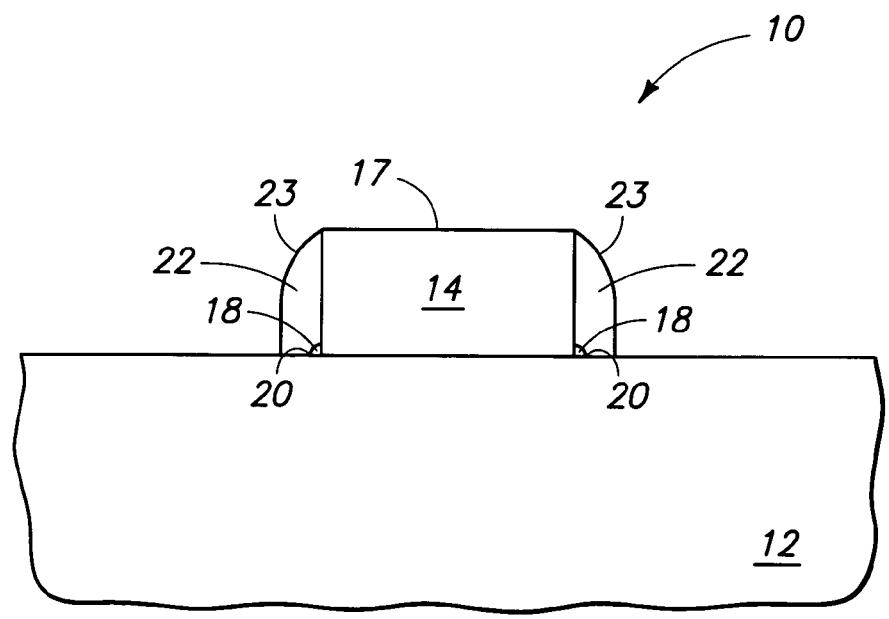
FIG. 7 is a view of the FIG. 6 substrate fragment at a processing step subsequent to that shown by FIG. 6.

Referring to FIG. 7, layer 22 has been subjected to any suitable anisotropic spacer etch, thus forming first spacers 23 over mask sidewalls 15, 16 and catalytic masses 20.

Such describes but one preferred method of performing exemplary first spacers 23, although any other existing or yet-to-be developed maskless or masked methods of forming sidewall spacers are contemplated.

Referring to FIG. 8, mask 14 (not shown) has been removed from over substrate 12, leaving a first spacer mask 24 over substrate 12. A preferred manner for removing mask 14 is by selective etching. For example, where material 22 comprises silicon dioxide and mask 14 comprises carbon, exemplary plasma etching chemistries to produce the FIG. 8 construction include $O_2$, or $O_2$ in combination with $NH_3$. For purposes of the continuing discussion, spacer mask 24 can be considered as comprising inner sidewalls 37, and catalytic masses 20 can be considered as comprising a respective sidewall 39 and a respective top or outer surface 41.

Referring to FIGS. 9 and 10, and using first spacer mask 24 as a mask, substrate 12 has been etched into to form a step wall 26 and a step wall 27. Accordingly and by way of example only in one implementation, an aspect of the invention encompasses forming a step wall by a method comprising etching into a substrate. For purposes of the continuing discussion, depicted step walls 26 and 27 can be considered as comprising a respective upper corner 28 and a respective base corner 30. Catalytic masses 20 are received proximate step walls 26 and 27, with the depicted exemplary FIGS. 9 and 10 embodiment showing catalytic material 18 of masses 20 being received both above the respective step walls and along an upper corner of the respective step walls. Further in one preferred embodiment, catalytic material 18 is of different composition than that of step walls 26, 27. Regardless, masking (not shown) might be utilized laterally outward of spacer mask 24 if it is desired to preclude recessing into substrate material(s) 12, as is shown. Further or alternately by way of example only, substrate material(s) 12 laterally outward of spacer mask 24 might be of different material(s) than that received laterally inward of the depicted spacer mask 24 to preclude such recessing laterally outward of spacer mask 24. Alternately, substrate material 12 might be etched into laterally outward (not shown) and laterally inward of spacer mask 24.

Referring to FIG. 11, a layer 32 has been deposited. Such might remain as part of the finished substrate construction or be sacrificial, and regardless might comprise any one or combination of conductive, insulative, and/or semiconductive materials. Further, material 32 might be of the same or different composition from that of material 22 of first spacer mask 24.

Figure 12:
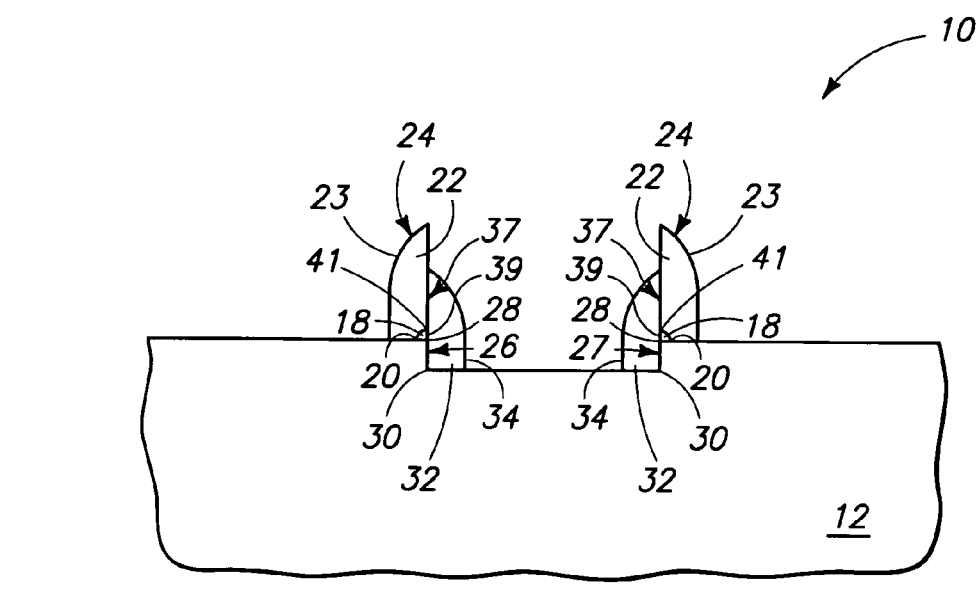
FIG. 12 is a view of the FIG. 11 substrate fragment at a processing step subsequent to that shown by FIG. 11.
Figure 13:
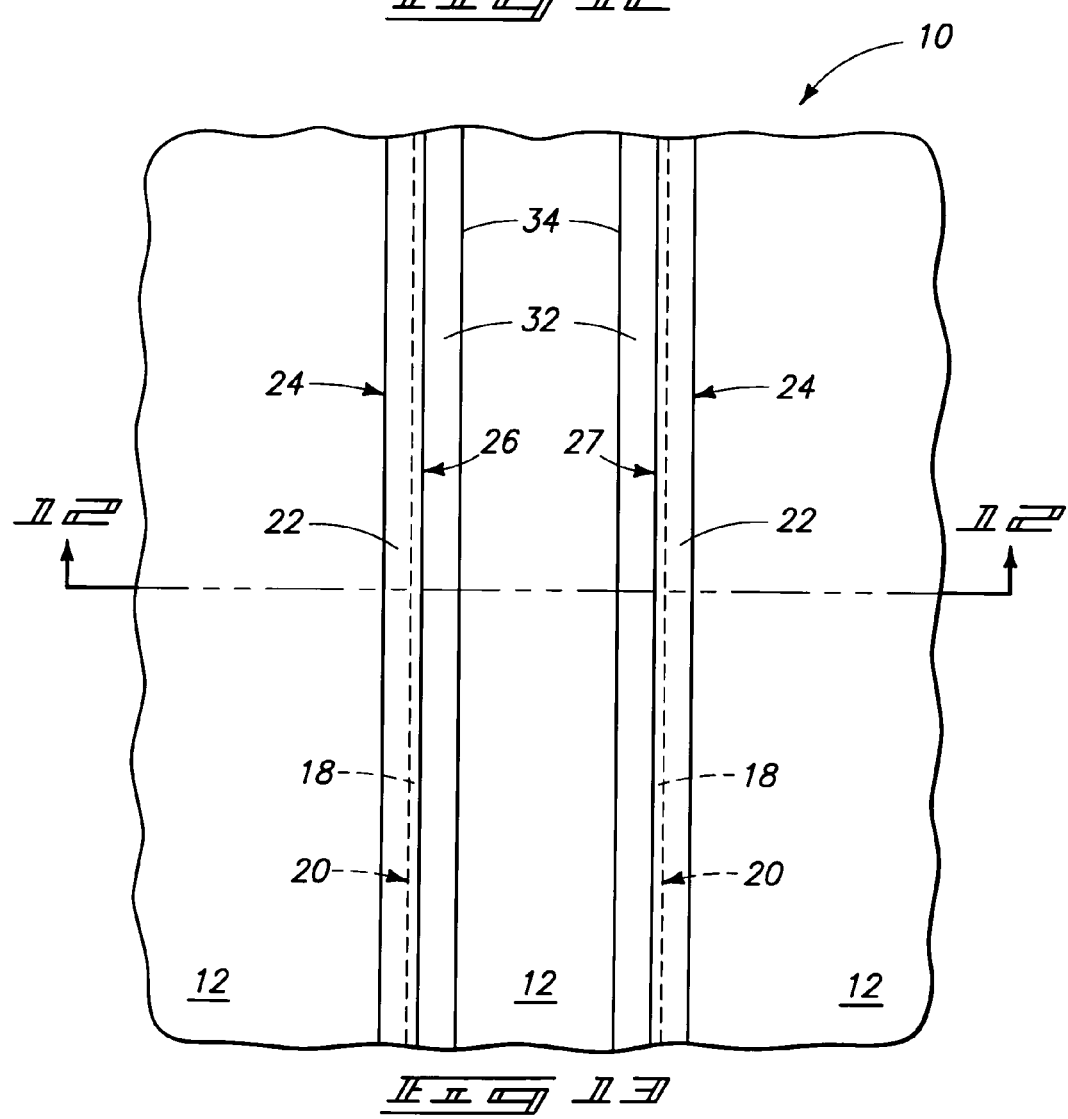
FIG. 13 is a top view of FIG. 12, with FIG. 12 being taken through line 12-12 in FIG. 13.

Referring to FIGS. 12 and 13, layer 32 has been anisotropically etched effective to form second spacers 34 over sidewalls 37 of first spacer mask 24, over sidewalls 39 of catalytic masses 20, and over the respective step walls 26, 27. Alternate techniques of forming an exemplary second spacer 34 might also be utilized, and whether existing or yet-to-be developed. Further, material 32 from which second spacers 34 are formed might also likely be received laterally outward of first spacer mask 24 (not shown).

Figure 14:
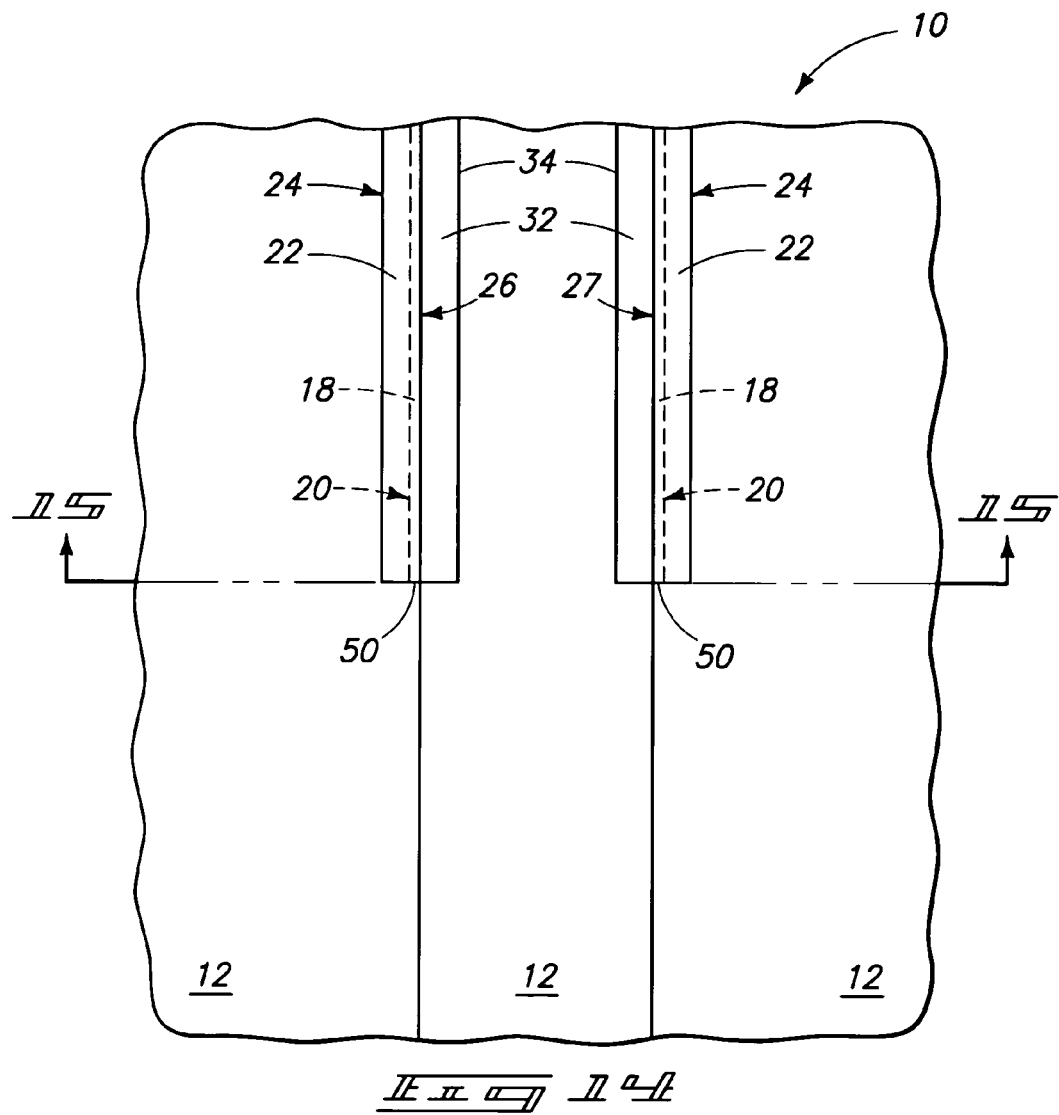
FIG. 14 is a top view of the FIG. 13 substrate fragment at a processing step subsequent to that shown by FIG. 13.
Figure 15:
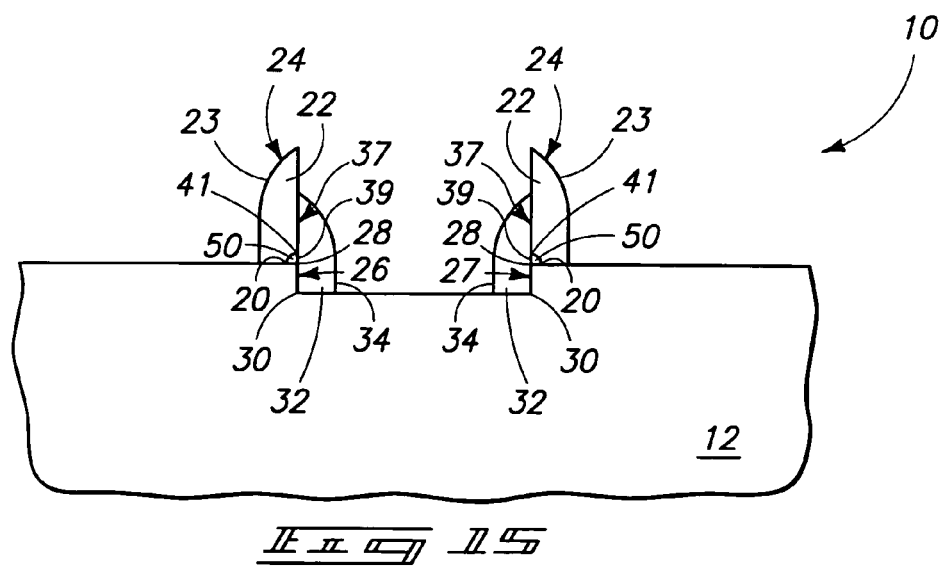
FIG. 15 is a sectional view of the FIG. 14 substrate fragment taken through line 15-15 in FIG. 14.

Referring to FIGS. 14-16, first spacer mask 24, catalytic masses 20, and second spacers 34 have been patterned in a common masking step to form unmasked end sidewalls 50 of catalytic masses 20 at upper corners 28 of step walls 26, 27, with remaining (most preferably all remaining) of elevationally outer surface 41 of catalytic masses 20 being masked. An exemplary technique for doing so includes photolithographic pattern and etch using one or more suitable, preferably substantially anisotropic, etching chemistries.

Referring to FIGS. 17 and 18, carbon nanotubes 52 have been grown from exposed end sidewalls 50 of catalytic masses 20 along step walls 26, 27 in a direction generally parallel to the general outer substrate orientation, as shown. Such grown carbon nanotubes might be of greater, equal, or lesser diameter in comparison to the step wall height, with greater diameter being depicted. Regardless, an exemplary existing preferred technique for forming carbon nanotubes 52 is by chemical vapor deposition (which may or may not be plasma enhanced) from catalytic material 18 of catalytic masses 20. Expected manner of growth is by the above-described base growth mechanism, although tip growth mechanism might alternately occur if some of material 18 were dislodged from the depicted substrate. Regardless, any existing or yet-to-be developed technique for such growth might be utilized. By way of example only, an exemplary technique is at a substrate temperature of least 600 C., a pressure from 1 Torr to 20 Torr, and utilizing any one or combination of methane, ethylene and acetylene as a hydrocarbon source gas. Pure or diluted hydrogen and/or ammonia might be also flowed. Plasma may or may not be utilized, and whether remote from or directly produced within the chamber within which carbon nanotube growth occurs. Further and of course, any of the depicted or other materials received over substrate 12 might be partially or completely etched from the substrate after carbon nanotube growth, and at least some of material 12 might also of course be etched. In one exemplary and preferred embodiment as shown, the sidewall portions 26 and 27 along which carbon nanotubes 52 are grown are straight linear generally parallel the substrate. However, curved and/or sidewall sections than join relative one another at an angle relative one another are also contemplated, and by way of example only.

By way of example only, carbon nanotube growth with respect to two sidewalls 26 and 27 is shown. Of course, one or more than two walls might be utilized for growing one or larger numbers of carbon nanotubes. Further by way of example only, a plurality of exemplary masking blocks 14 might be spaced adjacent one another at a minimum capable lithographic spacing, with the depicted exemplary spacer techniques enabling smaller size and or spacing of at least some adjacent carbon nanotubes than whatever is the then present minimum resolvable photolithographic feature spacing/size.

Figure 19:
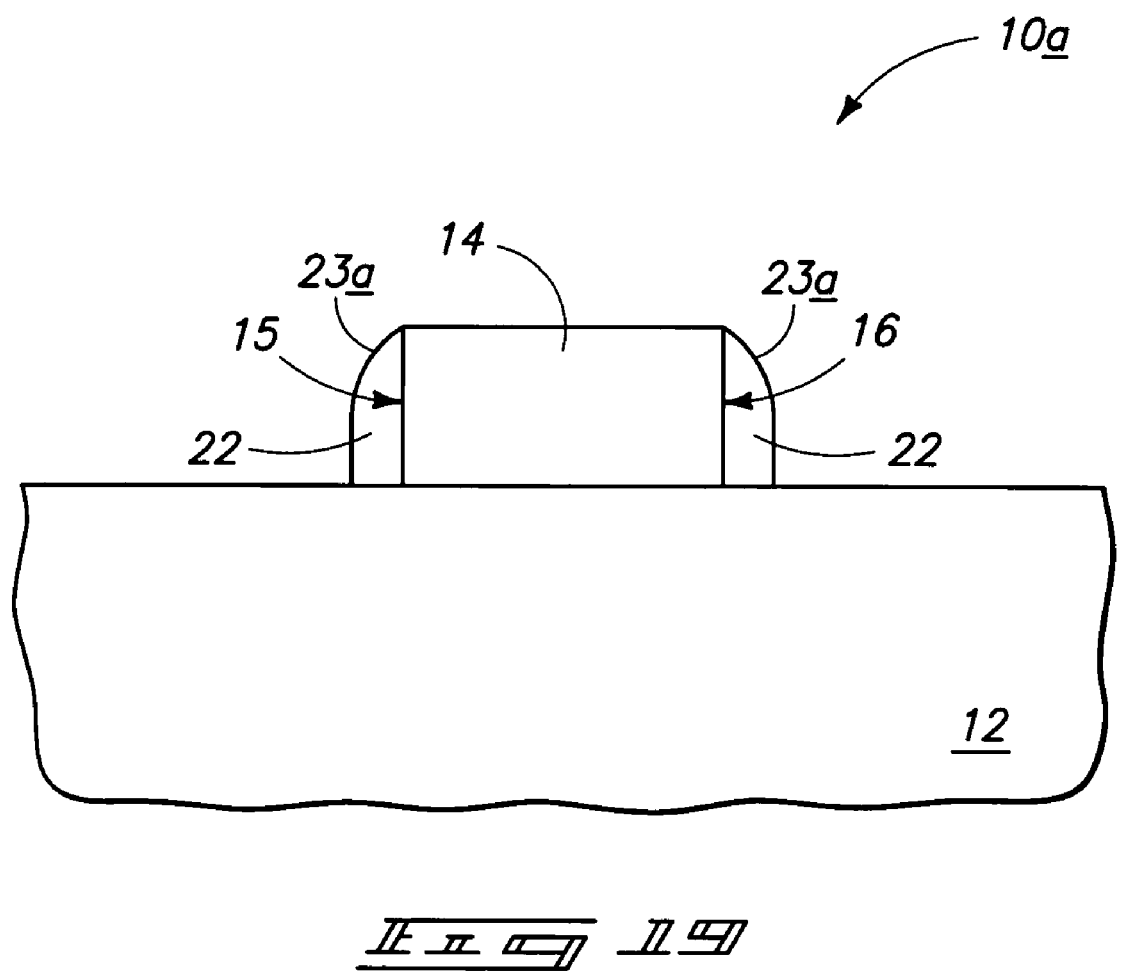
FIG. 19 is a diagrammatic section view of an alternate embodiment substrate fragment in process in accordance with an aspect of the invention.

By way of example only, an exemplary alternate method of forming a carbon nanotube is described with reference to FIGS. 19-30. Like numerals from the first described embodiment are utilized where appropriate, with differences being indicated with a suffix "a" or with different numerals. Referring first to FIG. 19, substrate fragment 10a comprises patterned mask 14 formed over substrate 12 and having first spacers 23a formed over mask sidewalls 15, 16. In the depicted exemplary FIG. 19 embodiment, catalytic masses (not shown) of the first described embodiment have yet-to-be formed.

Referring to FIGS. 20 and 21, mask 14 (not shown) has been removed from over substrate 12 leaving a first spacer mask 24a over substrate 12. A preferred technique is by etching, as referred to above. Using first spacer mask 24a as a mask, substrate 12 has been etched into to form step walls 26, 27, for example as described above. Regardless as in the first-described embodiment, masking (not shown) might be utilized laterally outward of spacer mask 24 if it is desired to preclude recessing into substrate material(s) 12, as is shown. Further or alternately by way of example only, substrate material(s) 12 laterally outward of spacer mask 24 might be of different material(s) than that received laterally inward of the depicted spacer mask 24 to preclude such recessing laterally outward of spacer mask 24. Alternately, substrate material 12 might be etched into laterally outward (not shown) and laterally inward of spacer mask 24.

Referring to FIG. 22, catalytic material 18a has been deposited over first spacer mask 24a and step walls 26, 27. Exemplary preferred materials and thicknesses are those as described above in the first embodiment with respect to material 18.

Figure 23:
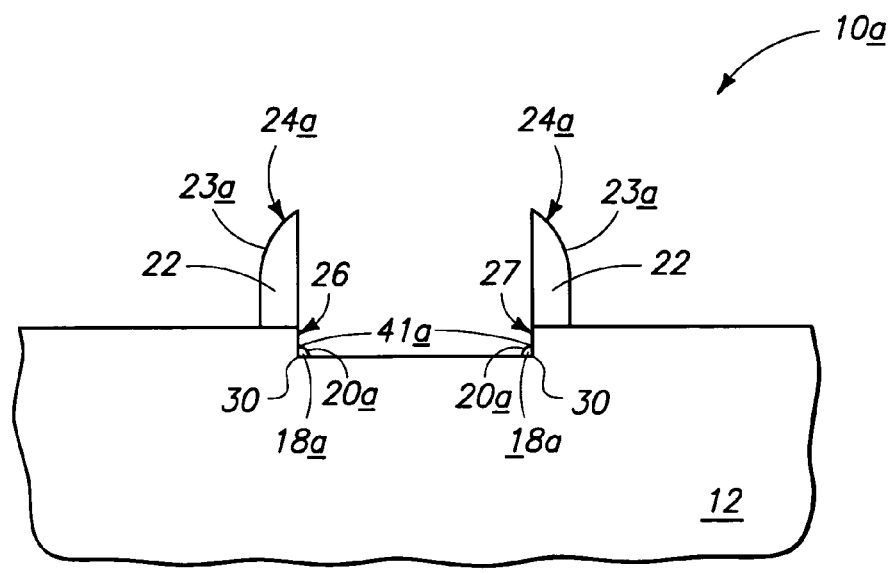
FIG. 23 is a view of the FIG. 22 substrate fragment at a processing step subsequent to that shown by FIG. 22.
Figure 24:
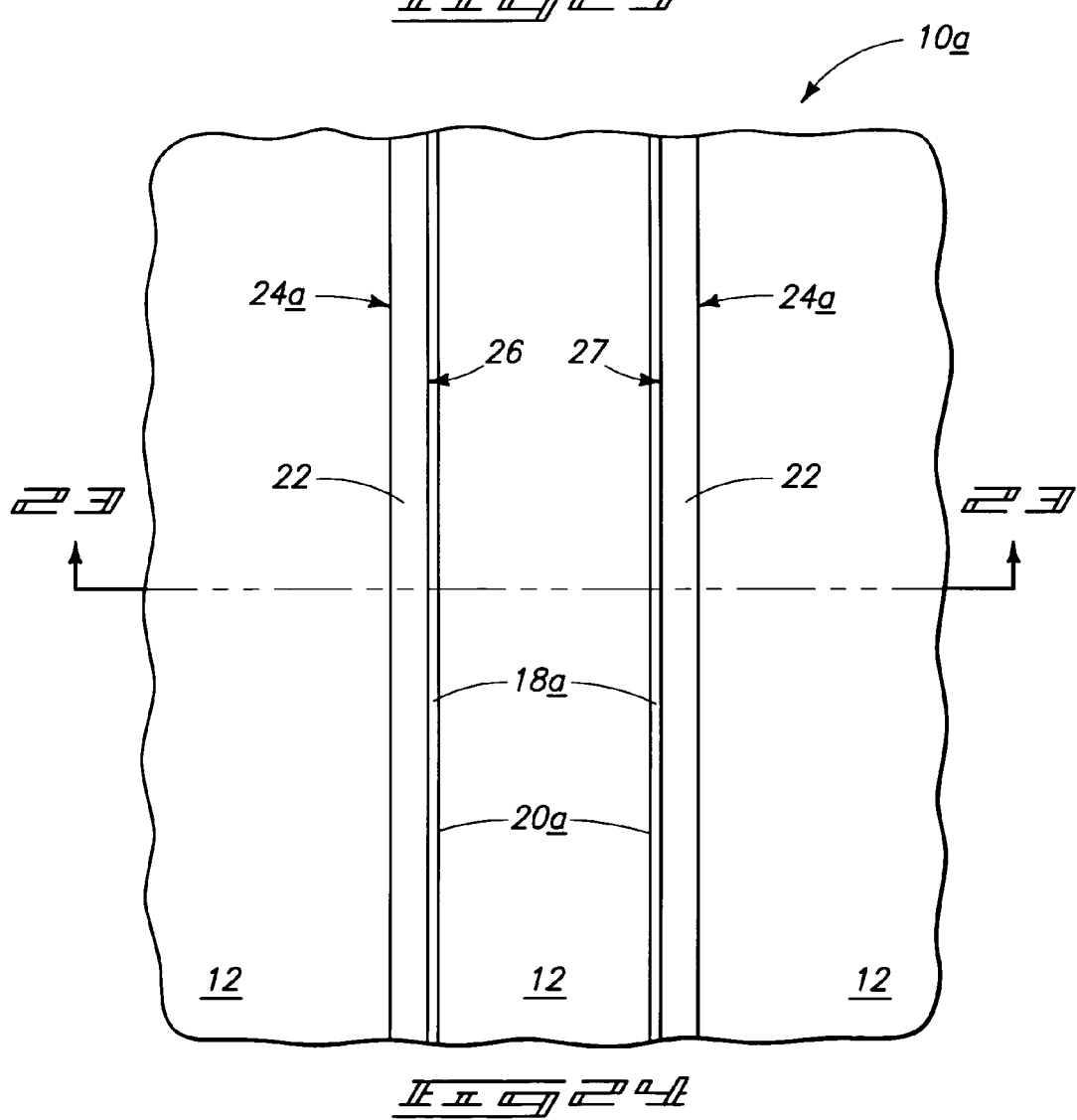
FIG. 24 is a top view of FIG. 23, with FIG. 23 being taken through line 23-23 in FIG. 24.

Referring to FIGS. 23 and 24, catalytic material 18a has been etched to form catalytic masses 20a over substrate 12 proximate base corners 30 of step walls 26, 27. Preferred techniques and dimensions are those as described above in connection with formation of catalytic masses 20 in the first-described embodiment.

Figure 25:
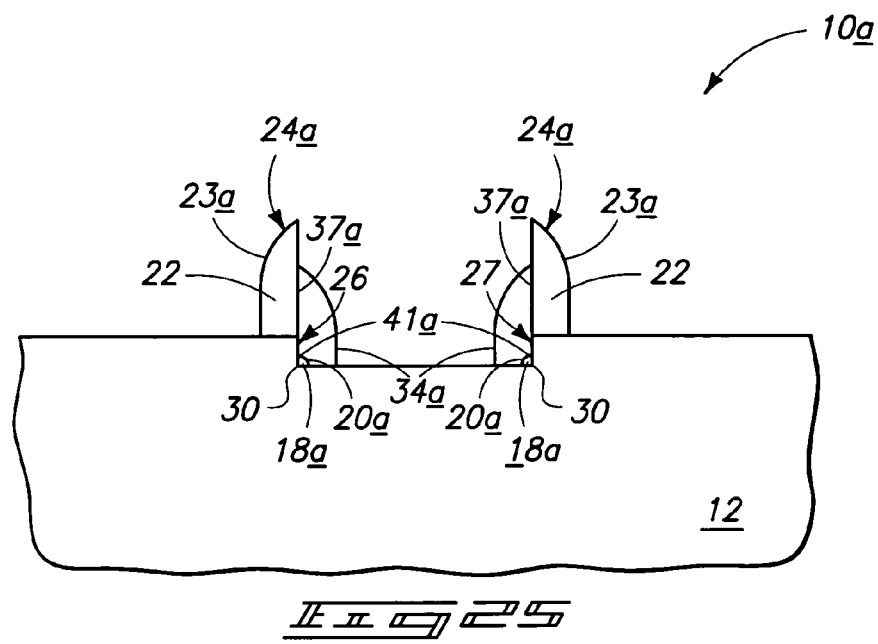
FIG. 25 is a view of the FIG. 23 substrate fragment at a processing step subsequent to that shown by FIG. 23.
Figure 26:
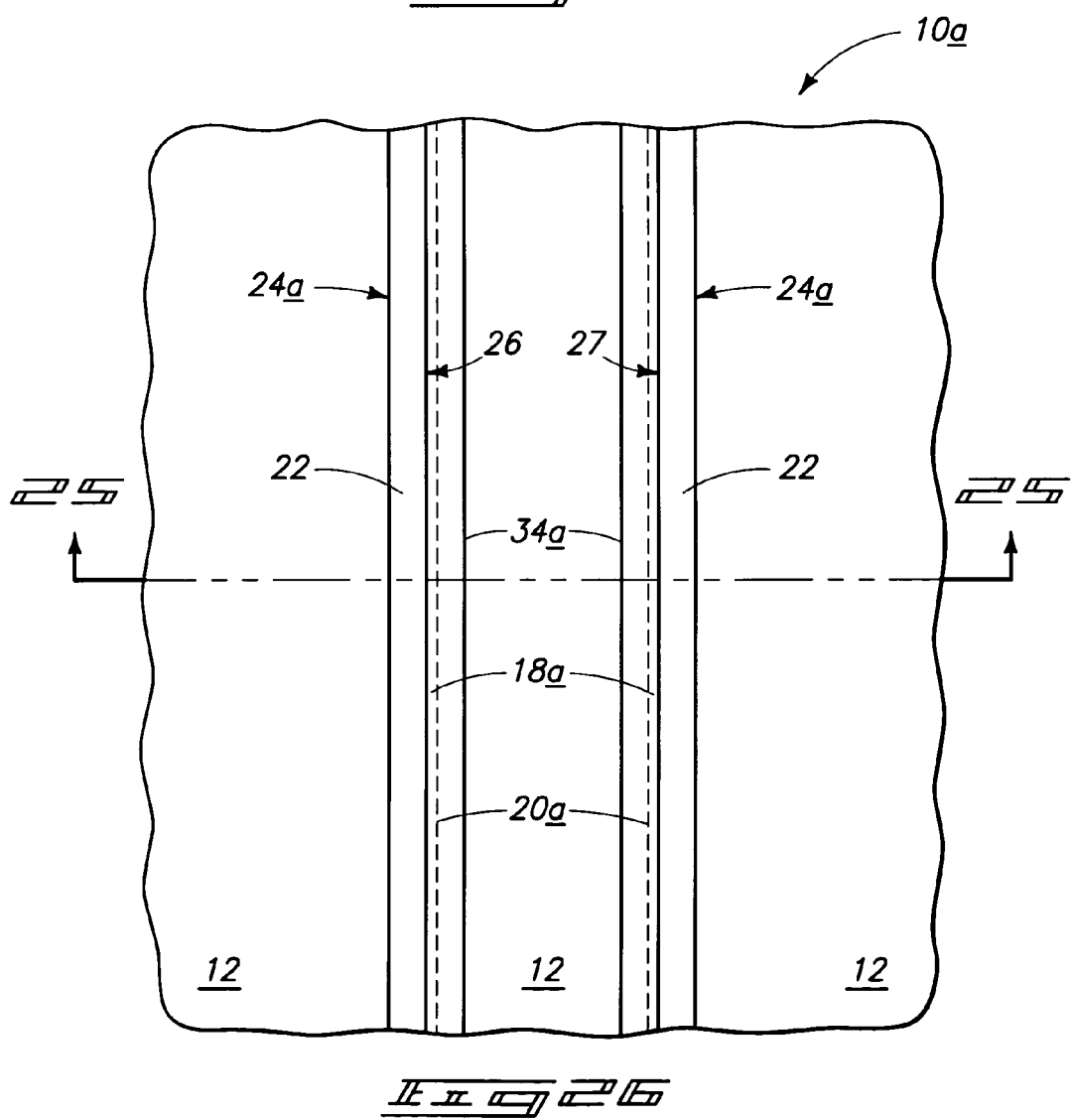
FIG. 26 is a top view of FIG. 25, with FIG. 25 being taken through line 25-25 in FIG. 26.
Figure 29:
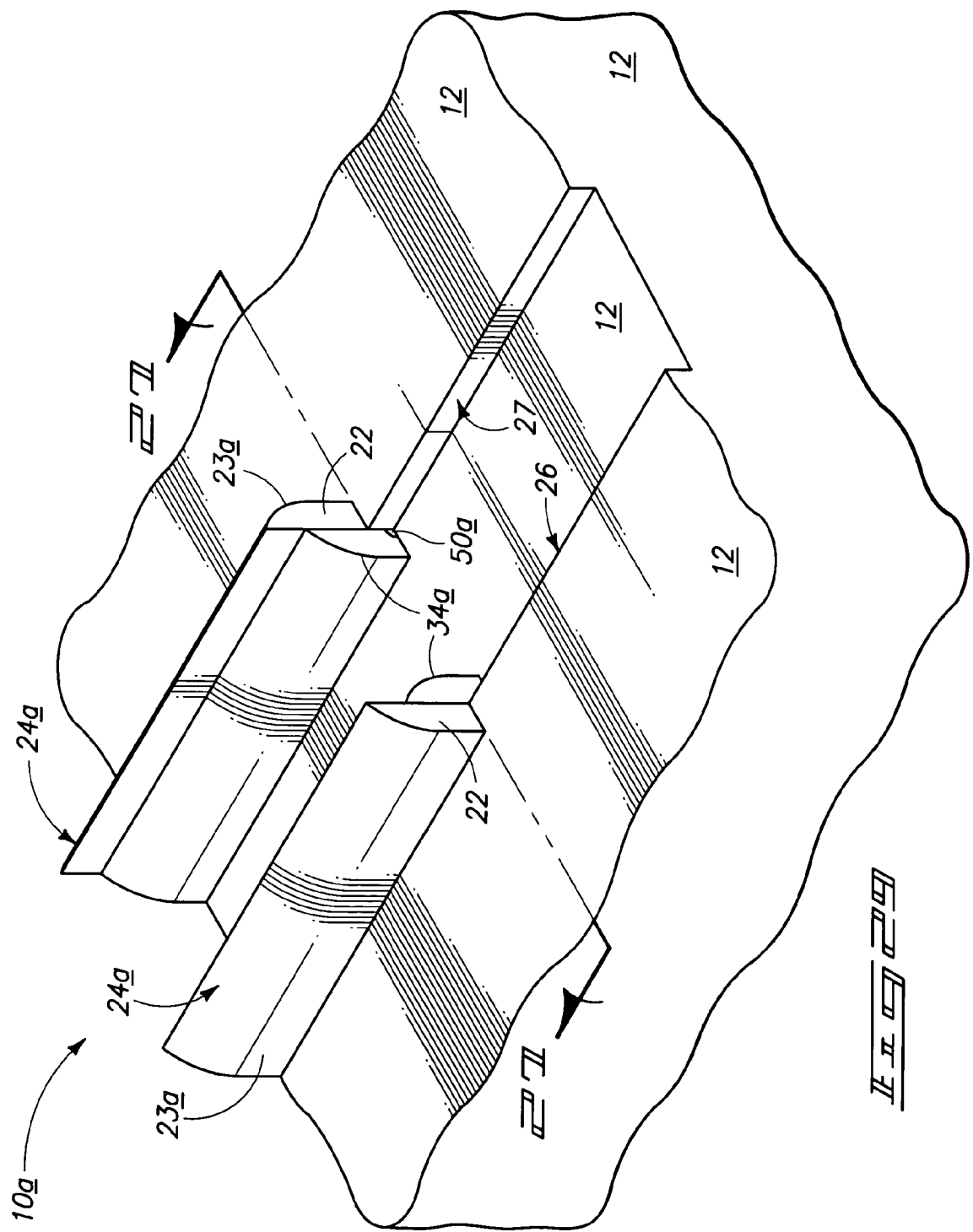
FIG. 29 is a perspective view of the FIGS. 27 and 28 substrate fragment.

Referring to FIGS. 25 and 26, second spacers 34a have been formed over sidewalls 37a of first spacer mask 24a, over catalytic masses 20a, and over step walls 26, 27. Accordingly by way of example only, such provides but one exemplary method of forming catalytic material proximate a step wall, in this instance being provided proximate a step wall base corner, and also wherein catalytic material 18a is received laterally over step walls 26, 27.

Referring to 27-29, catalytic masses 20a and at least second spacers 34a have been patterned in a common masking step to form an unmasked end sidewall 50a of catalytic masses 20a at base corners 30 of step walls 26, 27, with remaining of elevationally outer surfaces 41a of catalytic masses 20a being masked.

Referring to FIG. 30, carbon nanotubes 52 have been grown from exposed end sidewalls 50a of catalytic masses 20a along step walls 26, 27 generally parallel to the substrate. Any of the above-described techniques, or yet-to-be developed techniques, might be utilized. Further of course, some or all of the first and/or second spacers described above might be etched from the substrate subsequently. Such grown carbon nanotubes might be of greater, equal, or lesser diameter in comparison to the step wall height, with greater diameter being depicted.

Figure 31:
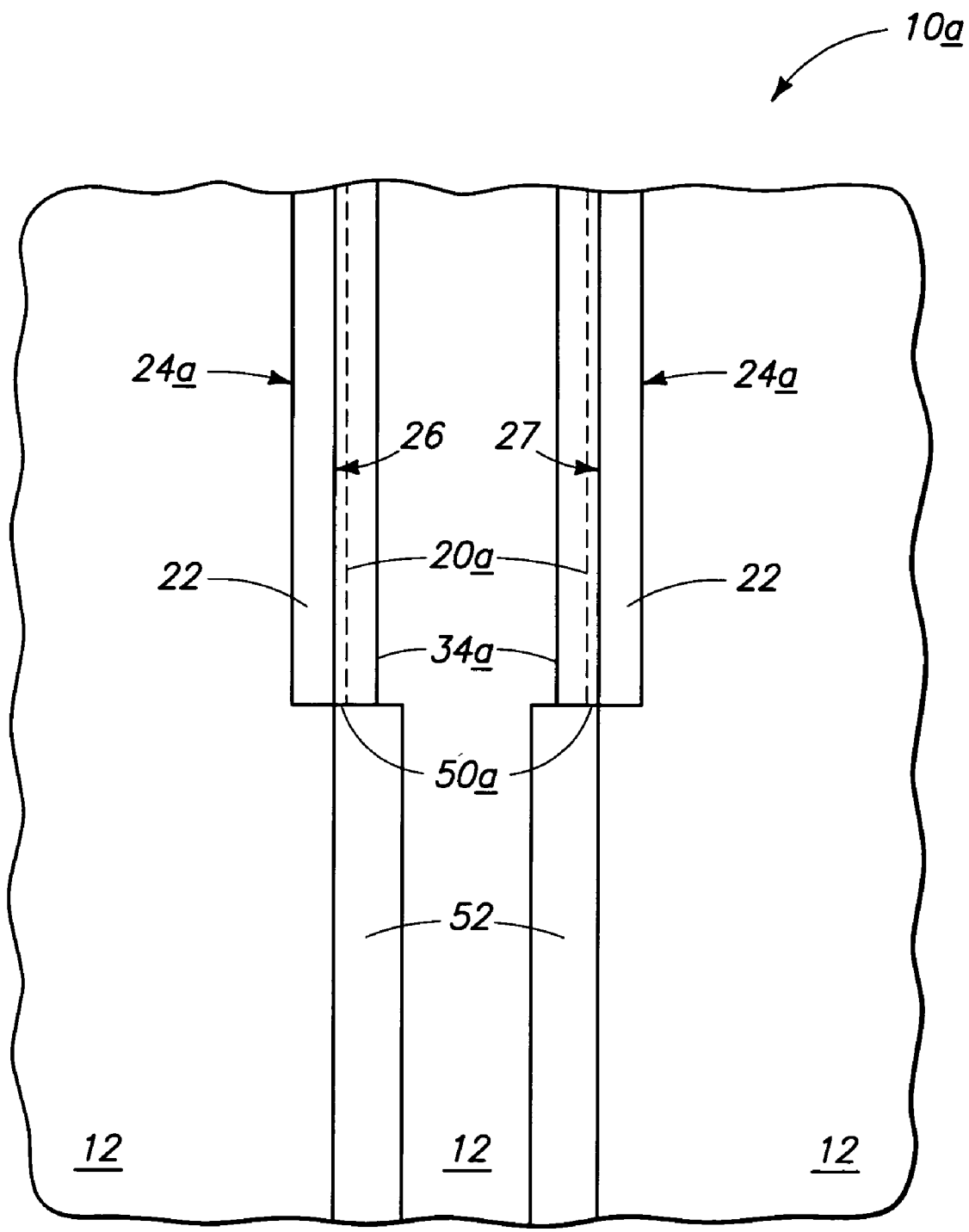
FIG. 31 is a diagrammatic section view of an alternate embodiment substrate fragment processed in accordance with an aspect of the invention.
Figure 31:
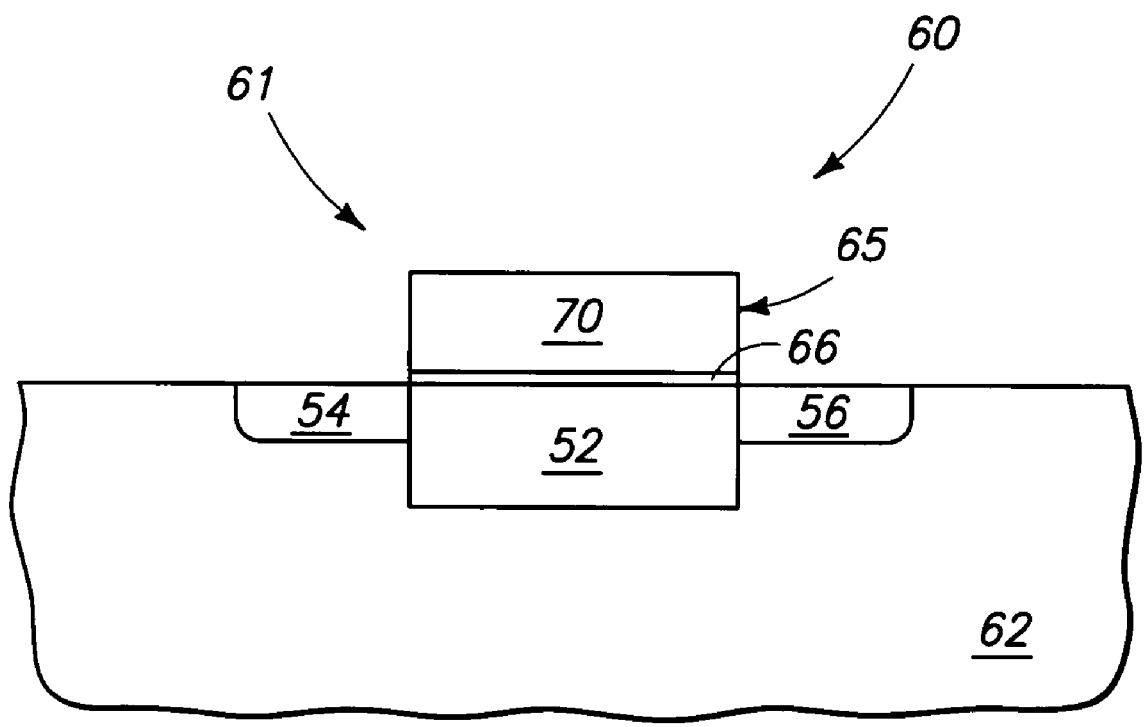

Regardless of implementation of either of the above-described general methods or of other methods, aspects of the invention encompass a method of fabricating integrated circuitry which comprise incorporating a carbon nanotube manufactured for example as described herein into a circuit component of an integrated circuit. Exemplary such components, and by way of example only, include field effect transistors, conductive lines, diodes, resistors, capacitors, switches, relays, field emission diodes, etc. By way of example only, FIG. 31 depicts an exemplary implementation wherein a carbon nanotube 52, for example manufactured as described above or below, is incorporated into a channel region of a field effect transistor. FIG. 31 depicts a substrate fragment 60 comprising a field effect transistor 61. Such is formed relative to a semiconductor substrate 62, for example a bulk monocrystalline silicon substrate, semiconductor-on-semiconductor substrate, etc. A carbon nanotube channel region 52 has been formed, for example as described herein, in or on some portion relative to substrate 62. Exemplary source/drain diffusion regions 54 and 56 are provided operably proximate channel region 52. An exemplary gate construction 65 comprises a gate dielectric region 66 and a conductive overlying metal or metal silicide region 70. Alternate constructions are, of course, contemplated and alternate or additional components are also contemplated.

An aspect of the invention can be considered as a method of fabricating integrated circuitry which comprises forming a step wall over a semiconductor substrate. By way of example only, either of the above-described embodiments with respect to FIGS. 1-18 and FIGS. 19-30 constitute but only exemplary methods of forming a step wall over a semiconductor substrate. Catalytic material is provided proximate the step wall, again for example and by way of example only, utilizing either of the above-described embodiments. An elevationally outer surface of the catalytic material is masked with a masking material. Again for example, and by way of example only, either of the above-described embodiments depict such masking, and in one preferred embodiment wherein the masking comprises deposition of a masking material, followed by maskless anisotropic etching thereof.

The catalytic material and the masking material are patterned to form an exposed end sidewall of the catalytic material proximate the step wall, with remaining of the elevationally outer surface of the catalytic material being masked. A carbon nanotube is grown from the exposed end sidewall of the catalytic material along the step wall generally parallel to the semiconductor substrate. The carbon nanotube can be incorporated into a circuit component of an integrated circuit.

In one implementation, a method of fabricating integrated circuitry comprises forming a patterned mask having a sidewall over a semiconductor substrate. A spacer is formed over the mask sidewall, and the mask is removed from over the substrate subsequently, leaving a spacer mask over the substrate. Using the spacer mask as an etch mask, the substrate is etched into to form a step wall. Masked catalytic material is provided proximate the step wall. Either of the above-described FIGS. 1-18 or FIGS. 19-30 embodiments contemplate an exemplary such method. Alternate methods as just so literally stated are also of course contemplated.

Regardless, the masked catalytic material and the spacer mask are patterned to form an unmasked end sidewall of the catalytic material proximate the step wall, with remaining of an elevationally outer surface of the catalytic material being masked. A carbon nanotube is grown from the exposed end sidewall of the catalytic material along the step wall generally parallel to the semiconductor substrate. The carbon nanotube can be incorporated into a circuit component of an integrated circuit.

In one implementation, the invention contemplates a method of forming a carbon nanotube. In such implementation, a step wall is formed over a substrate. Such can occur by any existing or yet-to-be developed manners, including those described above in connection with the exemplary embodiments of FIGS. 1-18 and FIGS. 19-30. Catalytic material of different composition than the step wall is provided proximate the step wall. Such catalytic material might be provided before or after the step wall is formed, and by any existing or yet-to-be developed method. By way of example only, the above-described FIGS. 1-18 and FIGS. 19-30 embodiments are exemplary such methods of so providing catalytic material proximate a step wall. Any alternate methods are also contemplated, and whether existing or yet-to-be developed. For example and by way of example only, catalytic material in particle or other form might be provided proximate a step wall on a substrate. Regardless, a carbon nanotube is grown from the catalytic material along the step wall generally parallel to the substrate. The carbon nanotube might or might not be incorporated into a circuit component of an integrated circuit.

One implementation of the invention contemplates a method of fabricating integrated circuitry comprising forming a plurality of step walls over a semiconductor substrate. Catalytic material of different composition than the step walls is provided proximate the step walls. Individual carbon nanotubes are grown from the catalytic material along the step walls generally parallel to the semiconductor substrate. Such individual carbon nanotubes might or might not be incorporated into circuit components of an integrated circuit.

Figure 32:
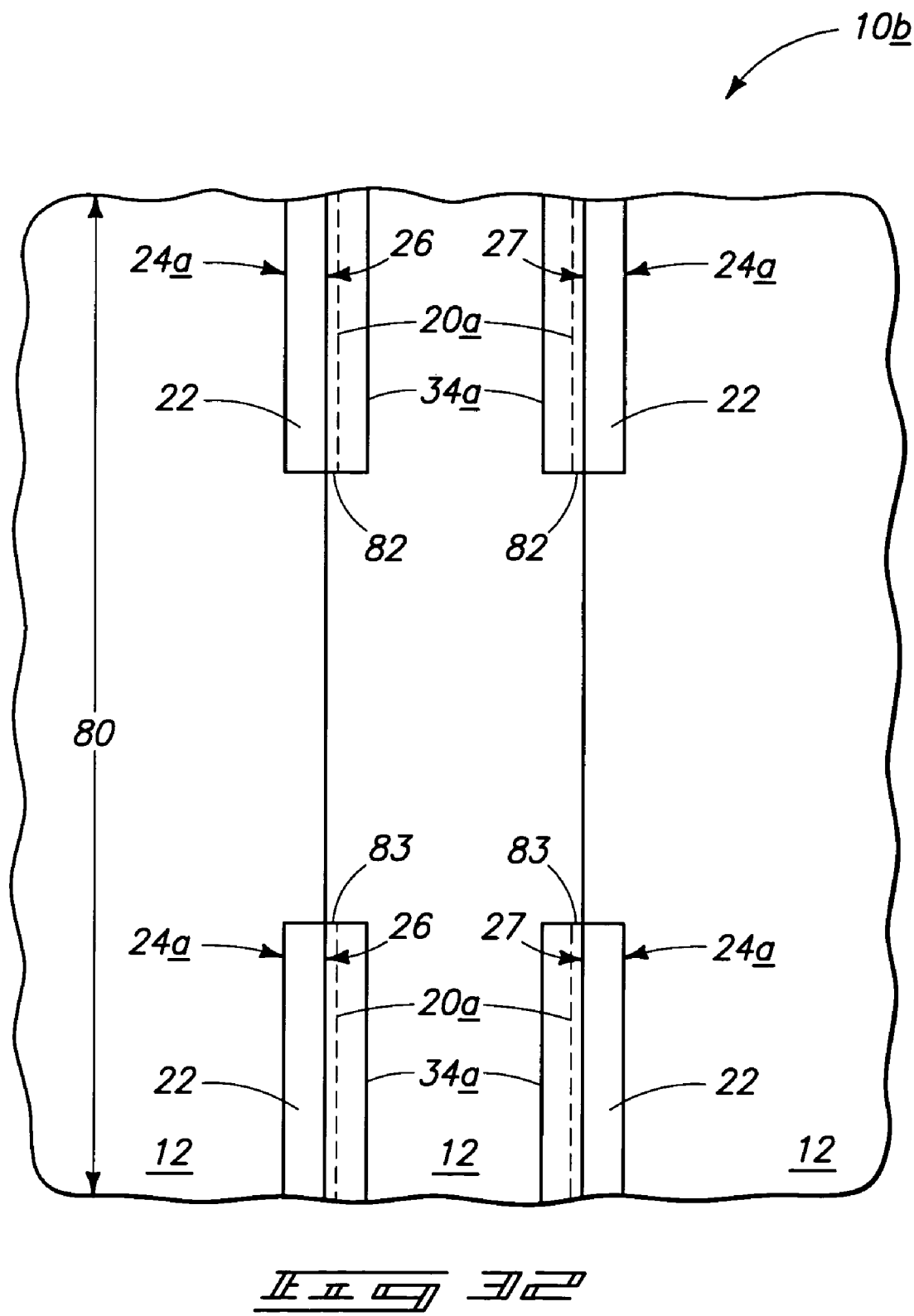
FIG. 32 is a diagrammatic top plan view of an alternate embodiment substrate fragment processed in accordance with an aspect of the invention.
Figure 33:
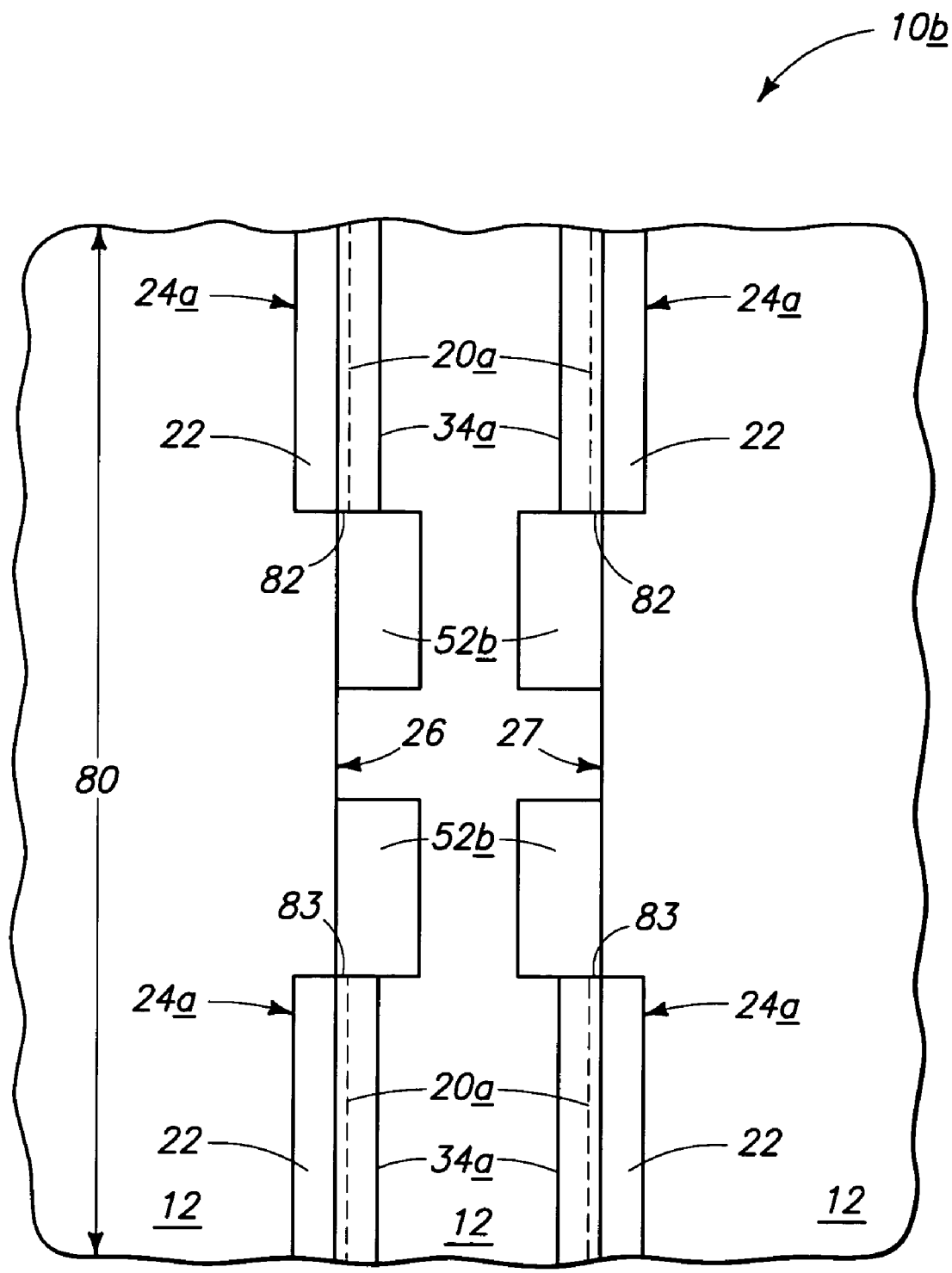
FIG. 33 is a top view of the FIG. 32 substrate fragment at a processing step subsequent to that shown by FIG. 32.

Further, and by way of example only, another exemplary implementation of a method of forming a carbon nanotube is described in connection with FIGS. 32-34. By way of example only, FIG. 32 depicts an alternate embodiment substrate to that depicted by FIG. 28. Like numerals have been utilized where appropriate, with differences being indicated with the suffix "b" or with different numerals. In FIG. 32, and by way of example only, the first and second spacers and catalytic masses have been patterned differently. Further for purposes of the continuing discussion, step walls 26, 27 can be considered as comprising some straight linear portion 80 which is generally parallel to substrate 12. Substrate 10b has been patterned such that a pair of catalytic material masses 82, 83 have been provided proximate the respective step walls 26 and 27, here of the same material relative one another by way of example only. Pairs of catalytic masses 82, 83 are spaced from one another at least along some portion of straight linear portion 80 of step walls 26, 27. The construction of FIG. 32 can be provided or formed by starting with the substrate of FIG. 26. Thereby, and by way of preferred example only, the pair of catalytic masses can be formed by depositing catalytic material over the substrate including at least some of the straight linear portion 80, and thereafter etching the catalytic material from said some portion to form the pair of spaced masses Referring to FIG. 33, carbon nanotubes 52b have been grown from each of catalytic material masses 82, 83 along the depicted portion of step walls 26, 27 generally parallel to the substrate and toward one another with respect to each step wall.

Figure 34:
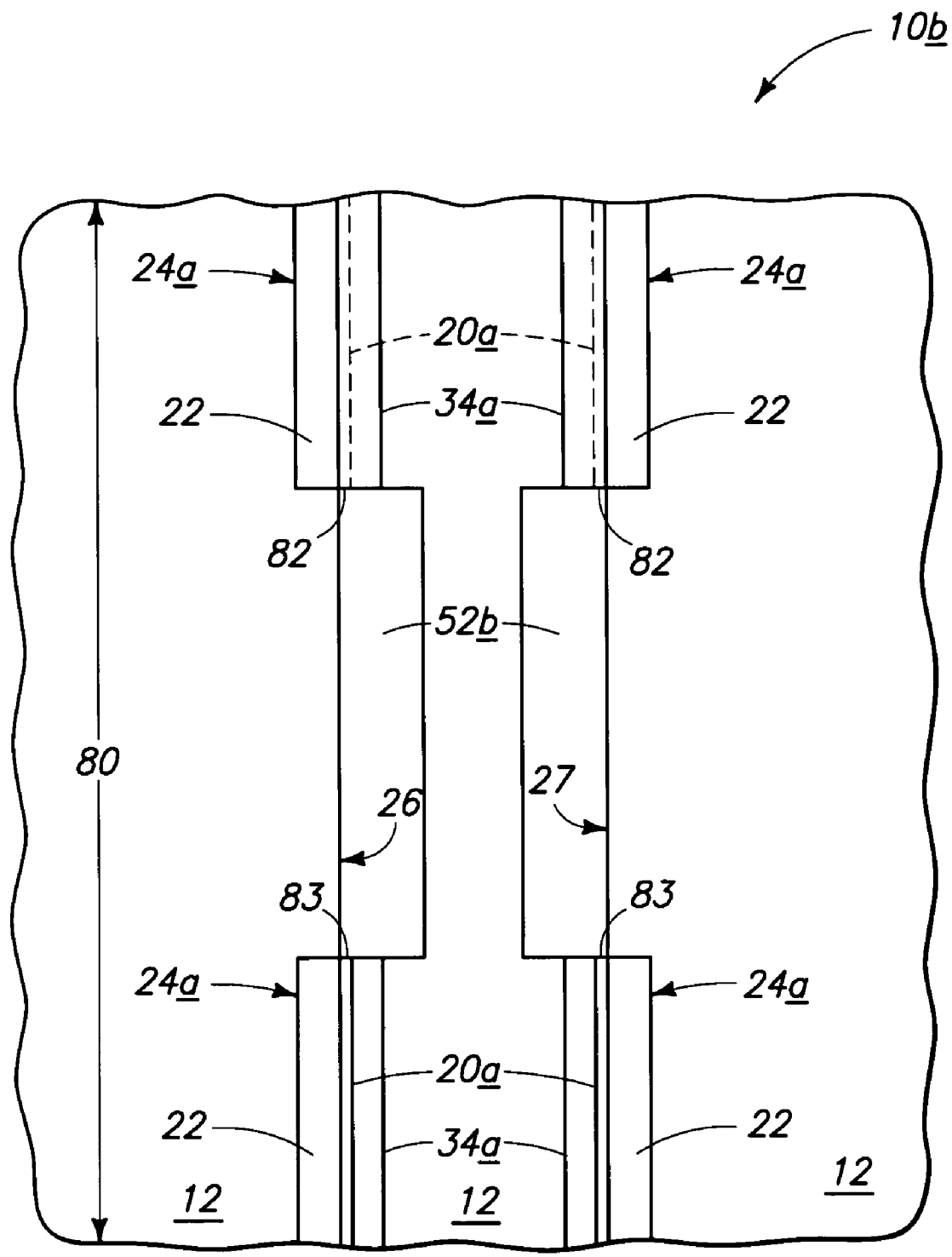
FIG. 34 is a top view of the FIG. 33 substrate fragment at a processing step subsequent to that shown by FIG. 33.

Further by way of example only as depicted in FIG. 34, the carbon nanotubes 52b have been grown toward one another effective to contact one another with respect to each step wall. Preferably as shown, spaced catalytic material masses 82, 83 do not move toward one another during such growth, with carbon nanotubes 52b being grown toward one another effective to form a respective single carbon nanotube spanning between the catalytic material masses with respect to each of the depicted step walls.

By way of example only, an exemplary alternate method of forming a carbon nanotube is described with reference to FIGS. 35-38. Like numerals from the second described embodiment are utilized where appropriate, with differences being indicated with a suffix "c". Referring first to FIGS. 35, 36, and 37, such corresponds in processing sequence to that of FIGS. 27, 28, and 29, respectively, of the second described embodiment. Processing prior thereto has occurred whereby substrate material 12 has been etched into laterally outward of spacer mask 24a as well as laterally therebetween. Thereby, catalytic masses 20c and spacers 34c thereover have been formed commensurate with fabrication of masses 20a and spacers 34a. Referring to FIG. 38, carbon nanotubes 52 and 52c have been grown from exposed end sidewalls 50a and 50c of catalytic masses 20a and 20c, respectively, along the respective step walls generally parallel to the substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a carbon nanotube, comprising:
   forming a step wall over a substrate;
   providing catalytic material of different composition than the step wall proximate the step wall; and
   growing a carbon nanotube from the catalytic material along and in contact with the step wall of different composition from the catalytic material and to be elongated generally parallel to the substrate.

2. The method of claim 1 wherein forming the step wall comprises etching into the substrate.

3. The method of claim 1 wherein the step wall comprises an upper corner, the catalytic material being provided proximate the step wall upper corner.

4. The method of claim 3 wherein the catalytic material is received above the step wall.

5. The method of claim 1 wherein the step wall comprises a base corner, the catalytic material being provided proximate the step wall base corner.

6. The method of claim 5 wherein the catalytic material is received laterally over the step wall.

7. A method of forming a carbon nanotube, comprising:
   forming a step wall over a substrate;
   providing catalytic material of different composition than the step wall proximate the step wall, the providing of the catalytic material comprising deposition of the catalytic material followed by maskless anisotropic spacer etching of the catalytic material; and
   growing a carbon nanotube from the catalytic material along the step wall to be elongated generally parallel to the substrate.

8. The method of claim 1 wherein the step wall along which the carbon nanotube is grown is substantially straight linear generally parallel to the substrate.

9. A method of forming a carbon nanotube, comprising:
   forming a step wall over a substrate; providing catalytic material of different composition than the step wall proximate the step wall; and
   using the step wall to grow a carbon nanotube from the catalytic material alone the step wall to have diameter which is greater than height of the step wall and to be elongated generally parallel to the substrate.

10. The method of claim 1 comprising growing the carbon nanotube to have diameter which is less than height of the step wall.

11. The method of claim 1 comprising growing the carbon nanotube to have diameter which is equal to height of the step wall.

12. A method of forming a carbon nanotube, comprising:
   forming a step wall over a substrate, the step wall comprising a straight linear portion generally parallel to the substrate;
   providing a pair of catalytic material masses proximate the step wall, the pair of catalytic masses being spaced and separated from one another in a non-contacting manner at least along some portion of the straight linear portion of the step wall; and
   growing a carbon nanotube generally parallel the substrate from each of the spaced and separated catalytic material masses along said some portion of the step wall, each of the carbon nanotubes having an end which moves in opposing direction toward the other carbon nanotube end during the growing.

13. The method of claim 12 wherein the spaced catalytic material masses are of common composition.

14. The method of claim 12 wherein the carbon nanotubes are grown toward one another such that their respective ends contact one another.

15. The method of claim 12 wherein the spaced catalytic material masses do not move toward one another during the growing, the carbon nanotubes being grown toward one another effective to form a single carbon nanotube spanning between the catalytic material masses.

16. The method of claim 12 wherein forming the step wall comprises etching into the substrate.

17. The method of claim 12 wherein providing the pair of catalytic masses comprises depositing catalytic material over the substrate including said some portion, and thereafter etching the catalytic material from said some portion to form the pair of spaced masses.

18. A method of fabricating integrated circuitry, comprising:
   forming a plurality of step walls over a semiconductor substrate;
   providing catalytic material of different composition than the step wails proximate the step walls;
   growing individual carbon nanotubes from the catalytic material along and in contact with the step walls of different composition from the catalytic material and to be elongated generally parallel to the semiconductor substrate; and
   incorporating the individual carbon nanotubes into circuit components of an integrated circuit.

19. A method of fabricating integrated circuitry, comprising:
   forming a step wall over a semiconductor substrate;
   providing catalytic material proximate the step wall;
   masking an elevationally outer surface of the catalytic material with a masking material;
   patterning the catalytic material and the masking material to form an exposed end sidewall of the catalytic material proximate the step wall with remaining of the elevationally outer surface of the catalytic material being masked;
   after the patterning and while said remaining of the elevationally outer surface of the catalytic material is masked, growing a carbon nanotube from the exposed end sidewall of the catalytic material along the step wall to be elongated generally parallel to the semiconductor substrate; and
   incorporating the carbon nanotube into a circuit component of an integrated circuit.

20. A method of fabricating integrated circuitry, comprising:
   forming a patterned mask having a sidewall over a semiconductor substrate;
   forming a spacer over the mask sidewall;
   removing the mask from over the substrate leaving a spacer mask over the substrate;
   using the spacer mask, etching into the substrate to form a step wall;
   providing masked catalytic material proximate the step wall;
   patterning the masked catalytic material and the spacer mask to form an unmasked end sidewall of the catalytic material proximate the step wall with remaining of an elevationally outer surface of the catalytic material being masked;
   growing a carbon nanotube from the exposed end sidewall of the catalytic material along the step wall generally parallel to the semiconductor substrate; and
   incorporating the carbon nanotube into a circuit component of an integrated circuit.

21. A method of fabricating integrated circuitry, comprising:
   forming a patterned mask having a sidewall over a substrate;
   depositing catalytic material over the patterned mask;
   etching the catalytic material to form a catalytic mass over the substrate proximate a base of the mask sidewall;
   forming a first spacer over the mask sidewall and the catalytic mass;
   removing the mask from over the substrate leaving a first spacer mask over the substrate;
   using the first spacer mask, etching into the substrate to form a step wall, the catalytic mass being received proximate and along an upper corner of the step wall; forming a second spacer over a sidewall of the first spacer mask, over a sidewall of the catalytic mass, and over the step wall;
   patterning the first spacer mask, the catalytic mass, and the second spacer in a common masking step to form an unmasked end sidewall of the catalytic mass at the upper corner of the step wall with remaining of an elevationally outer surface of the catalytic mass being masked;
   growing a carbon nanotube from the exposed end sidewall of the catalytic mass along the step wall generally parallel to the substrate; and
   incorporating the carbon nanotube into a circuit component of an integrated circuit.

22. A method of fabricating integrated circuitry, comprising:
   forming a patterned mask having a sidewall over a substrate;
   forming a first spacer over the mask sidewall;
   removing the mask from over the substrate leaving a first spacer mask over the substrate;
   using the first spacer mask, etching into the substrate to form a step wall;
   depositing catalytic material over the first spacer mask and step wall;
   etching the catalytic material to form a catalytic mass over the substrate proximate a base corner of the step wall;
   forming a second spacer over a sidewall of the first spacer mask, over the catalytic mass, and over the step wall;
   patterning the catalytic mass and the second spacer in a common masking step to form an unmasked end sidewall of the catalytic mass at the base corner of the step wall with remaining of an elevationally outer surface of the catalytic mass being masked;
   growing a carbon nanotube from the exposed end sidewall of the catalytic mass along the step wall generally parallel to the substrate; and
   incorporating the carbon nanotube into a circuit component of an integrated circuit.

23. The method of claim 18 wherein the components comprise field effect transistors.

24. The method of claim 23 wherein the carbon nanotubes comprise channel regions of said field effect transistor.

25. The method of claim 18 wherein the components comprise conductive lines.

26. The method of claim 18 wherein the step walls comprise respective upper corners, the catalytic material being provided proximate the step wall upper corners.

27. The method of claim 18 wherein the step walls comprise respective base corners, the catalytic material being provided proximate the step wall base corners.

28. The method of claim 18 wherein the step walls along which the carbon nanotubes are grown are substantially straight linear generally parallel to the substrate.

29. The method of claim 19 wherein the catalytic material comprises metal.

30. The method of claim 19 wherein the catalytic material is of different composition than the step wall.

31. The method of claim 19 wherein the masking comprises deposition of the masking material, and maskless anisotropic etching thereof.

32. The method of claim 19 wherein the step wall comprises an upper corner, the catalytic material being provided proximate the step wall upper corner.

33. The method of claim 19 wherein the step wall comprises a base corner, the catalytic material being provided proximate the step wall base corner.

34. The method of claim 20 wherein removing the mask comprises etching.

35. The method of claim 20 wherein the catalytic material is of different composition than the step wall.

36. The method of claim 20 wherein the step wall comprises an upper corner, the catalytic material being provided proximate the step wall upper corner.

37. The method of claim 20 wherein the step wall comprises a base corner, the catalytic material being provided proximate the step wall base corner.

38. The method of claim 20 wherein providing the masked catalytic material comprises deposition of a masking material over catalytic material, followed by maskless anisotropic etching of the masking material.

39. The method of claim 21 wherein the patterned mask comprises carbon.

40. The method of claim 21 wherein the catalytic material comprises metal.

41. The method of claim 21 wherein etching to form the catalytic mass forms such mass in the shape of a bead along the base of the mask sidewall, and having a thickness less than height of the mask sidewall.

42. The method of claim 21 wherein the first spacer and the second spacer are of different composition.

43. The method of claim 21 wherein the first spacer and the second spacer are of common composition.

44. The method of claim 22 comprising etching the first spacer from the substrate after the growing.

45. The method of claim 22 comprising etching the second spacer from the substrate after the growing.

46. The method of claim 22 comprising etching the first and second spacers from the substrate after the growing.

47. The method of claim 22 wherein etching to form the catalytic mass forms such mass in the shape of a bead of a thickness less than height of the step wall.

48. The method of claim 1 wherein the catalytic material comprises at least one of iron, nickel, cobalt, or molybdenum.

49. The method of claim 1 wherein the growing comprises exposure to plasma.

* * * * *

UNITED STATES PATENT AND TRADEMARK OFFICE
CERTIFICATE OF CORRECTION

| | |
|---|---|
| PATENT NO. | : 7,625,766 B2 |
| APPLICATION NO. | : 11/445708 |
| DATED | : December 1, 2009 |
| INVENTOR(S) | : Gurtej S. Sandhu |

It is certified that error appears in the above-identified patent and that said Letters Patent is hereby corrected as shown below:

In column 10, line 42, in Claim 9, delete "alone" and insert -- along --, therefor.

In column 11, line 21, in Claim 18, delete "wails" and insert -- walls --, therefor.

Signed and Sealed this

Ninth Day of February, 2010

David J. Kappos
*Director of the United States Patent and Trademark Office*